(12) United States Patent
Shinohara et al.

(10) Patent No.: US 11,183,256 B2
(45) Date of Patent: Nov. 23, 2021

(54) SEMICONDUCTOR MEMORY DEVICE AND MEMORY STATE DETECTING METHOD

(71) Applicant: Kioxia Corporation, Minato-ku (JP)

(72) Inventors: Koichi Shinohara, Fujisawa (JP);
Katsuki Matsudera, Kawasaki (JP);
Ian Christopher Gamara, Yokohama (JP); Yoshikazu Harada, Kawasaki (JP); Noritaka Kai, Kawasaki (JP);
Yusuke Tanefusa, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/914,733

(22) Filed: Jun. 29, 2020

(65) Prior Publication Data
US 2021/0082531 A1 Mar. 18, 2021

(30) Foreign Application Priority Data
Sep. 13, 2019 (JP) .............................. JP2019-166809

(51) Int. Cl.
*G11C 16/04* (2006.01)
*G11C 16/34* (2006.01)
(Continued)

(52) U.S. Cl.
CPC ........ *G11C 16/3472* (2013.01); *G06F 9/3001* (2013.01); *G06F 9/30101* (2013.01);
(Continued)

(58) Field of Classification Search
CPC ..... G11C 16/3472; G11C 16/08; G11C 16/14; G11C 16/24; G06F 9/3001; G06F 9/30101; G06F 9/30189
(Continued)

(56) References Cited

U.S. PATENT DOCUMENTS 5,414,664 A * 5/1995 Lin ..................... G11C 16/16
365/185.13
5,615,148 A * 3/1997 Yamamura ............. G11C 29/52
365/185.11
(Continued)

FOREIGN PATENT DOCUMENTS

JP 2013-25826 A 2/2013
JP 2013-229080 A 11/2013
JP 2016-51486 A 4/2016

*Primary Examiner* — Viet Q Nguyen
(74) *Attorney, Agent, or Firm* — Oblon, McClelland, Maier & Neustadt, L.L.P.

(57) ABSTRACT

According to a certain embodiment, the semiconductor memory device includes a memory cell array, a control circuit, and a data register storing an erase verify fail flag. An erase target block is divided into word line groups. The control circuit includes: a counter configured to count the number of the erase verify fail flags to be output as a count value for each group; a plurality of counter registers configured to store the count value for each group; an arithmetic circuit configured to take a difference of the plurality of count values respectively stored in the plurality of counter registers and to output a result of the difference as a number of second fail flags; and a comparator configured to compare the number of criteria of the erase verify fail flag and the number of the second fail flags to be output as a memory state detected result.

20 Claims, 28 Drawing Sheets

(51) Int. Cl.
  *G11C 16/14* (2006.01)
  *G11C 16/08* (2006.01)
  *G06F 9/30* (2018.01)
  *G11C 16/24* (2006.01)

(52) U.S. Cl.
  CPC .......... *G06F 9/30189* (2013.01); *G11C 16/08* (2013.01); *G11C 16/14* (2013.01); *G11C 16/24* (2013.01)

(58) Field of Classification Search
  USPC ............................................ 365/185.22, 218
  See application file for complete search history.

(56) References Cited

U.S. PATENT DOCUMENTS

| | | | | |
|---|---|---|---|---|
| 5,805,501 A | * | 9/1998 | Shiau | G11C 16/16 365/185.29 |
| 5,963,477 A | * | 10/1999 | Hung | G11C 16/16 365/185.11 |
| 8,218,368 B2 | * | 7/2012 | Won | G11C 16/16 365/185.25 |
| 9,589,651 B1 | * | 3/2017 | Tsuda | G11C 29/028 |
| 10,942,799 B1 | * | 3/2021 | Khakifirooz | G11C 16/3431 |
| 2013/0286742 A1 | | 10/2013 | Komine et al. | |

* cited by examiner

SEMICONDUCTOR MEMORY DEVICE AND MEMORY STATE DETECTING METHOD

CROSS REFERENCE TO RELATED APPLICATIONS

This application is based upon and claims the benefit of priority from prior Japanese Patent Application No. P2019-166809 filed on Sep. 13, 2019, the entire contents of which are incorporated herein by reference.

FIELD

Embodiments described herein relate generally to a semiconductor memory device and a memory state detecting method.

BACKGROUND

NAND flash memories have been known as one type of semiconductor memory devices. In such semiconductor memory devices, a method of detecting a state of memory cells caused due to production variations or the like has been proposed.

DETAILED DESCRIPTION

Next, certain embodiments will now be described with reference to drawings. In the description of the following drawings to be explained, the identical or similar reference sign is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Certain embodiments disclosed herein provide a semiconductor memory device and a memory state detecting method, each capable of detecting a current leak due to a defect or degradation which occurs in a memory cell in a short time.

According to one embodiment, the semiconductor memory device includes: a memory cell array comprising a plurality of memory cells, word lines, and bit lines; a control circuit connected to the memory cell array; and a data register connected to the memory cell array, the data register configured to store an erase verify fail flag indicating a fail as a result of an erase verify operation for each memory cell. An erase target block of the semiconductor memory device is divided into word line groups. The control circuit comprising: a counter configured to receive the erase verify fail flag from the data register, to count a number of the received erase verify fail flags, and to output the counted number thereof as a count value for each group of the memory cell in which the erase verify operation executed; a plurality of counter registers configured to respectively store the count values output from the counter for the respective group; an arithmetic circuit configured to take a difference of the plurality of count values respectively stored in the plurality of counter registers and to output a result of the difference as a number of second fail flags; a criteria register configured to store a number of criteria of the erase verify fail flags set in advance as a number of first fail flags; and a comparator configured to compare the number of the first fail flags stored in the criteria register with the number of the second fail flags output from the arithmetic circuit, and to detect a memory state on the basis of a comparison result to be output as a detected result.

First Embodiments (Memory System)

Figure 1:
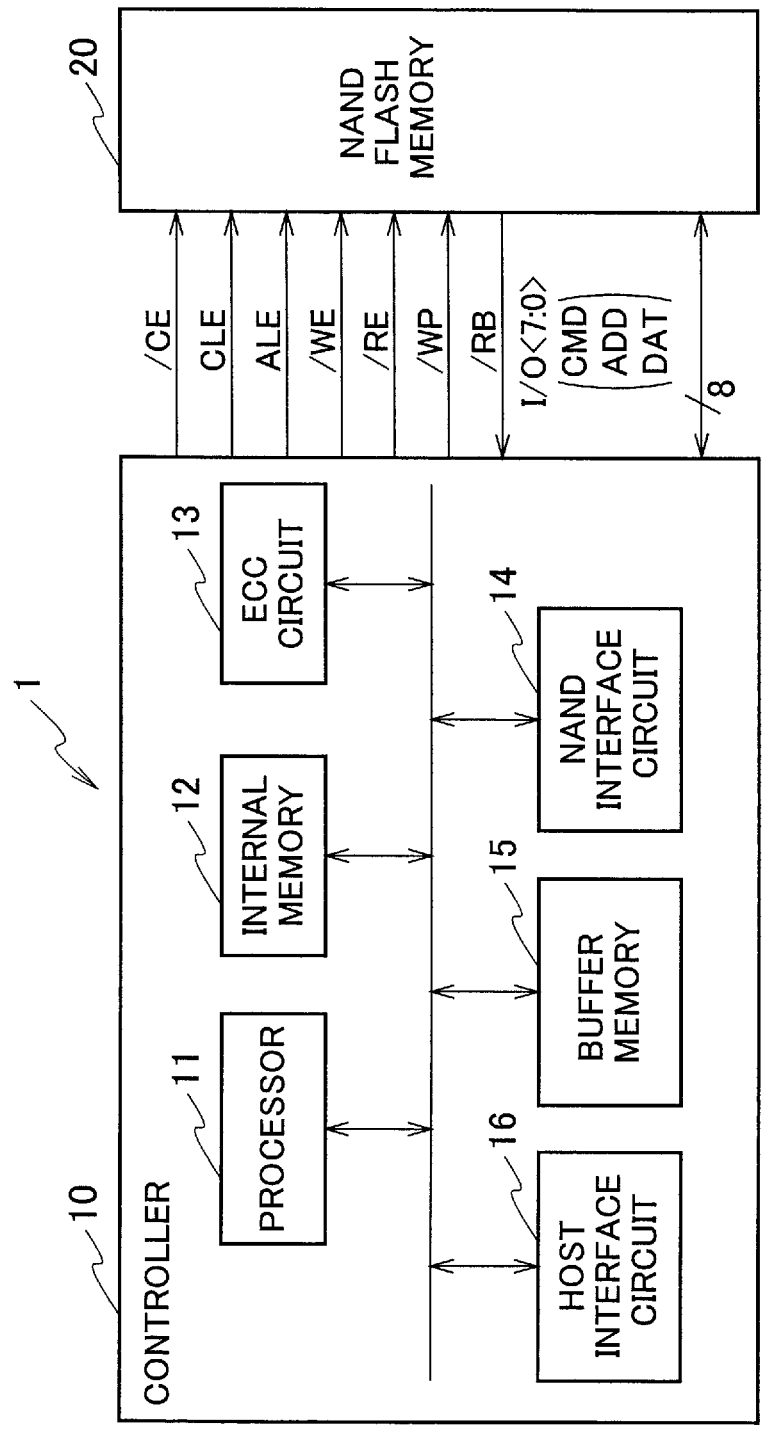
FIG. 1 is a block diagram for explaining a configuration of a memory system to which a semiconductor memory device according to a first embodiment is applied.

FIG. 1 illustrates a block configuration example of a memory system 1 to which a semiconductor memory device 20 according to the present embodiment is applied.

As illustrated in FIG. 1, the memory system 1 includes a controller 10 and a semiconductor memory device (e.g., a NAND flash memory) 20. The controller 10 receives a command from host devices (not illustrated) and controls the semiconductor memory device 20 on the basis of the received command. More specifically, the controller 10 writes data instructed to be written by the host device into the semiconductor memory device 20, and reads data instructed to be read by the host device from the semiconductor memory device and transmits the read data to the host device. The controller 10 is connected to the semiconductor memory device 20 through a NAND bus. The semiconductor memory device 20 includes a plurality of memory cells and stores data in a nonvolatile manner. In FIG. 1, illustration of a part of signal lines is omitted.

As illustrated in FIG. 1, the controller 10 includes a processor (e.g., a Central Processing Unit (CPU)) 11, an internal memory (e.g., Random Access Memory (RAM)) 12, an Error Check and Correction (ECC) circuit 13, a NAND interface circuit 14, a buffer memory 15, and a host interface circuit 16.

The processor 11 controls the overall operation of the controller 10. The processor 11 issues a read instruction based on the NAND interface standard to the semiconductor memory device 20, for example, in response to a data read instruction received from the host device. This operation is the same in the case of a write operation and an erase operation. The processor 11 has a function of executing various operations on read data from the semiconductor memory device 20.

The internal memory 12 is, for example, a semiconductor memory such as a dynamic RAM (DRAM) and is used as a work area of the processor 11. The internal memory 12 stores firmware for managing the semiconductor memory device 20, various management tables, and the like.

The ECC circuit 13 executes error detection and error correction processing. More specifically, when data is written, an Error Correcting Code (ECC) is generated for each set including a certain number of pieces of data on the basis of data received from the host device. When data is read out, ECC decoding is executed on the basis of the ECC code to detect the presence or absence of an error. Moreover, when an error is detected, a bit position where the error is detected is specified to correct the error.

The NAND interface circuit 14 is connected to the semiconductor memory device 20 via the NAND bus, and is responsible for communication with the semiconductor memory device 20. The NAND bus transmits various control signals and input/output signals. The control signal includes a chip enable signal /CE, a command latch enable signal CLE, an address latch enable signal ALE, a write enable signal /WE, a read enable signal /RE, a write protect signal /WP, and a ready busy signal RB. The input/output signal I/O (I/O<7:0>) is, for example, an 8-bit signal. The input/output signal I/O (I/O<7:0>) is data transmitted and received between the semiconductor memory device 20 and the controller 10, and includes a command CMD, address data ADD, and data DAT, for example. Under the instruction of the processor 11, the NAND interface circuit 14 transmits the command CMD, the address ADD, and write data to the semiconductor memory device 20. The NAND interface circuit 14 also receives read data from the semiconductor memory device 20.

The buffer memory 15 temporarily stores data and the like received by the controller 10 from the semiconductor memory device 20 and the host device. The buffer memory 15 is also used, for example, as a storage area for temporarily stores read data from the semiconductor memory device 20, an operation result on read data, and the like.

The host interface circuit 16 is connected to the host device and manages the communication with the host device. The host interface circuit 16 transfers respectively, for example, an instruction and data received from the host device to the processor 11 and the buffer memory 15.

(Configuration of Semiconductor Memory Device)

Figure 2:
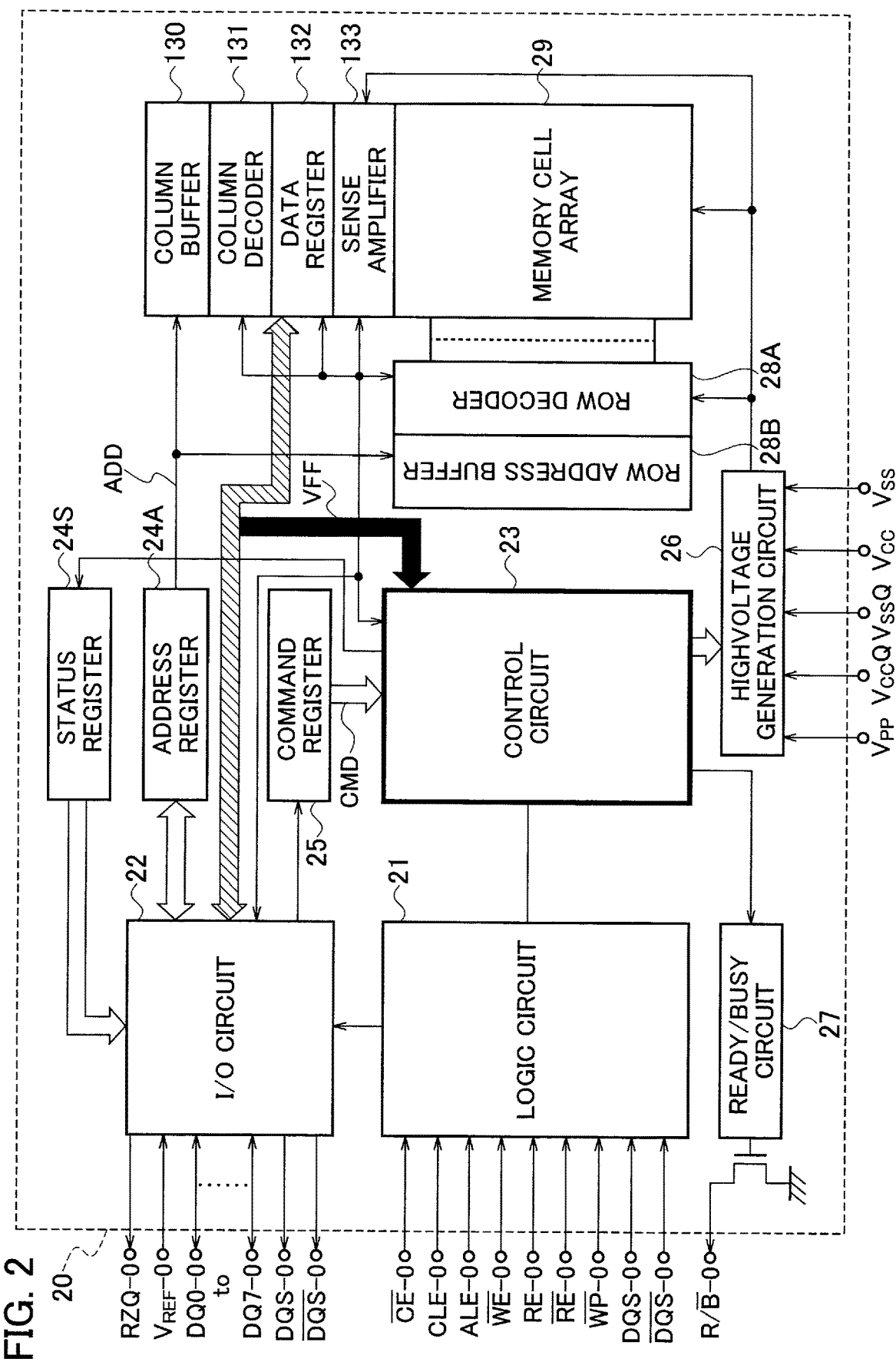
FIG. 2 is a block diagram for explaining an example of a configuration of the semiconductor memory device according to the first embodiment.

As illustrated in FIG. 2, the semiconductor memory device 20 includes a logic circuit 21, an input/output (I/O) circuit 22, a status register 24S, an address register 24A, a command register 25, a control circuit 23, a high voltage generation circuit 26, a ready/busy circuit 27, a memory cell array 29, a row decoder 28A, a row address buffer 28B, a column buffer 130, a column decoder 131, a data register 132, and a sense amplifier 133.

The logic circuit 21 receives a chip enable signal CE, a command latch enable signal CLE, a address latch enable signal ALE, a write enable signal WE, a read enable signal RE, a clock signal DQS, and the like from the controller 10.

The chip enable signal CE is a signal for activating the semiconductor memory device 20 and is asserted when accessing the semiconductor memory device 20. The command latch enable signal CLE and the address latch enable signal ALE are signals which notify the semiconductor memory device 20 that input signals supplied to the semiconductor memory device 20 are respectively a command and an address. The write enable signal WE is a signal for acquiring the input signal into the semiconductor memory device 20. The read enable signal RE is a signal for reading output signals from the semiconductor memory device 20. The signal DQS is an input/output clock. The logic circuit 21 transmits the above-mentioned signals to the input/output (I/O) circuit 22 and the control circuit 23, as required.

The I/O circuit 22 receives the signals transmitted from the logic circuit 21 and transmits the signals DQS to the controller 10. The I/O circuit 22 transmits/receives a plurality of input/output signals DQ (DQ0 to DQ7, hereinafter abbreviated as DQ signals) to/from the controller 10. The DQ signals have a width of 8 bits, for example, and include a command CMD, write data and read data DATA, an address ADD, and various management data. The I/O circuit 22 sends a switching command to the command register 25, when the switching command for switching the semiconductor memory device 20 to a busy state is received from the controller 10. The busy state used herein means a state where the semiconductor memory device 20 cannot receive a command from the host device.

The I/O circuit 22 transmits the address ADD to the address register 24A when the DQ signal is the aforementioned addresses ADD, and transmits the command CMD to the command register 25 when the DQ signal is the aforementioned command CMD. Furthermore, when writing the data, the I/O circuit 22 transmits the write data to the sense amplifier 133 when the DQ signal is the write data. Moreover, when reading the data, the I/O circuit 22 transmits the read data transferred from the sense amplifier 133 to the controller 10 with the signals DQS/DQSn.

The address register 24A stores the address transmitted from the I/O circuit 22, supplies a column address to the column buffer 130, and supplies a row address to the row address buffer 28B. The status register 24S stores various status information of the semiconductor memory device 20. The command register 25 stores the command transmitted from the I/O circuit 22.

The control circuit 23 controls the high voltage generation circuit 26, the status register 24S, and the ready/busy circuit 27 at the timing when the various signals are received by the logic circuit 21, in accordance with the command CMD transmitted from the command register 25.

The control circuit 23 switches the semiconductor memory device 20 to the busy state on the basis of the switching command transmitted from the command register 25. When the semiconductor memory device 20 is shifted to the busy state, the control circuit 23 operates as a master and the controller 10 operates as a slave. When the semiconductor memory device 20 is released from the busy state, the control circuit 23 operates as the slave and the controller 10 operates as the master.

The high voltage generation circuit 26 receives reference power supply voltages Vss and Vcc, voltages VssQ and VccQ, and the like, and generates voltages required for a write operation of data, a read operation of data, an erase operation of data, and the like from the above-mentioned received voltages. The high voltage generation circuit 26 generates voltages on the basis of the instruction from the control circuit 23, and supplies the generated voltages to the memory cell array 29, the row decoder 28A, and the sense amplifier 133.

The ready/busy circuit 27 transmits a ready/busy signal R/B which indicates whether the semiconductor memory device 20 is in the ready state (a state where the semiconductor memory device 20 can receive the command transmitted from the host device) or in the busy state (a state where the semiconductor memory device 20 cannot receive the command transmitted from the host device) to the controller 10, on the basis of the signal transmitted from control circuit 23.

Although details will be described later with reference to FIG. 4, the memory cell array 29 includes a plurality of memory cell transistors MT, word lines WL, bit lines BL, and the like. The data register 132 is connected to the memory cell array 29 and stores an erase verify fail flag VFF. The erase verify fail flag VFF used herein is a flag for indicating a fail as a result of an erase verify operation with respect to an erase verify target group. The column buffer 130 temporarily stores the address signal and the like supplied from the address register 24A, and supplies the supplied signal and the like to the column decoder 131.

The column decoder 131 selects specific bit line BL, a sense amplifier, and the like, on the basis of the signal etc. supplied from the column buffer 130. The column decoder 131 controls division of a range (group) in which the erase verify operation is executed. The sense amplifier 133 reads data stored in a memory cell (memory cell transistor MT) in the memory cell array 29 through the bit line BL, and detects a state of the memory cell in the memory cell array 29 through the bit line BL.

The row address buffer 28B temporarily stores the address signal and the like supplied from the address register 24A, and supplies the supplied signal and the like to the row decoder 28A. The row decoder 28A receives a voltage from the high voltage generation circuit 26, and applies the voltage to specific word line WL on the basis of the address signal.

(Configuration of Control Circuit)

Figure 3:
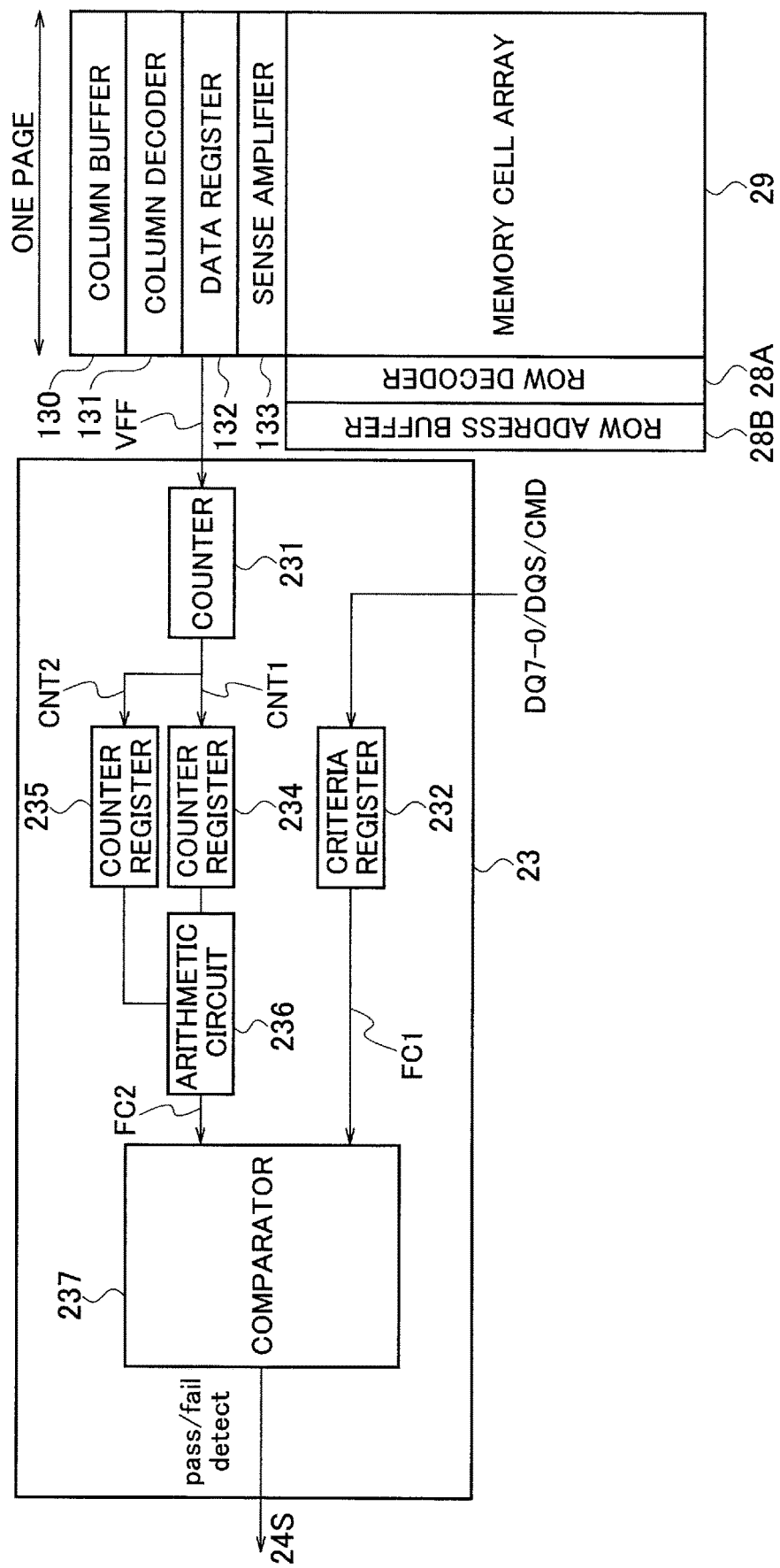
FIG. 3 is a block diagram for explaining an example of a configuration of a control circuit included in the semiconductor memory device according to the first embodiment.

As illustrated in FIG. 3, the control circuit 23 includes a counter 231, a plurality of counter registers (234 and 235), an arithmetic circuit 236, a criteria register 232, and a comparator 237.

The counter 231 receives the erase verify fail flag VFF from the data register 132, and counts the number of the received erase verify fail flags VFF.

The plurality of counter registers (234 and 235) store respectively count values (CNT1 and CNT2) output from the counter 231 for respective ranges (groups) in which the erase verify operation are executed.

The arithmetic circuit 236 takes a difference between the plurality of count values (CNT1 and CNT2) respectively stored in the plurality of counter registers (234 and 235), and outputs the difference result as the number of second fail flags FC2.

The criteria register 232 stores criteria (the number of criteria) of fail flags which is set in advance as the number of first fail flags FC1.

The comparator 237 compares the number of the first fail flags FC1 stored in the criteria register 232 with the number of the second fail flags FC2 output from the arithmetic circuit 236, and detects a memory state on the basis of the comparison result to be output as a detected result (to be returned to the status register 24S).

Detailed processing contents of erase verify operation and detailed operation examples of each unit of the control circuit 23 will be described later.

(Circuit Configuration Example of Memory Cell Array)

Figure 4:
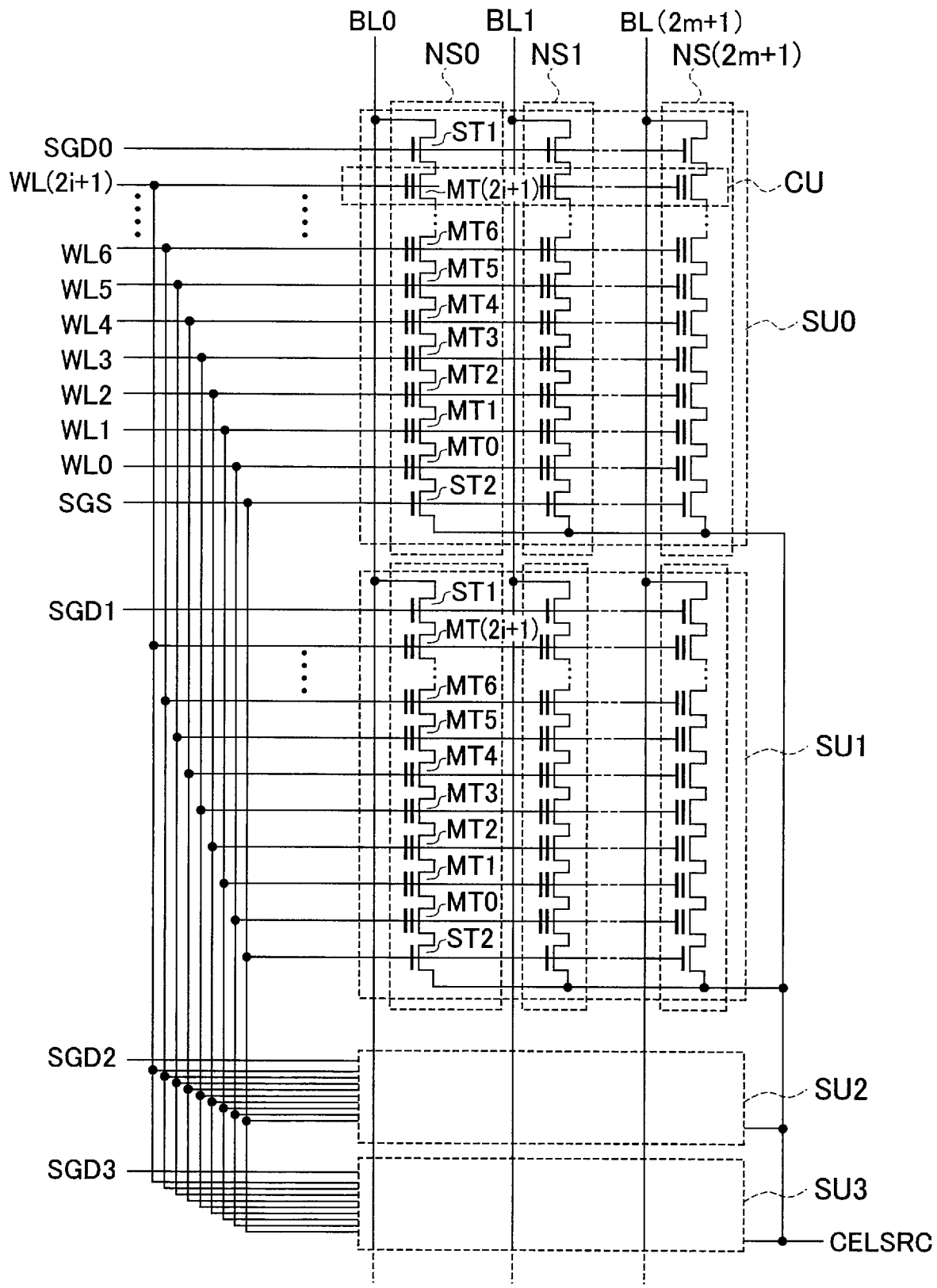
FIG. 4 is a circuit diagram for explaining a configuration of a memory cell array included in the semiconductor memory device according to the first embodiment.

FIG. 4 illustrates a circuit configuration example of the memory cell array 29 included in the semiconductor memory device 20. As illustrated in FIG. 4, each of the NAND strings NS includes (2i+2) memory cell transistors MT (MT0 to MT(2i+1)) (where i is a natural number), a select transistor ST1, and a select transistor ST2, for example. The number (2i+2) of the memory cell transistors MT may be, for example, 8, 16, 32, 64, 96, 128 or the like, and the number thereof is not limited thereto. The memory cell transistor MT includes a stacked gate structure including a control gate and a charge storage layer. Moreover, the memory cell transistor MT may include a stacked gate structure including a control gate and a floating gate. Each memory cell transistor MT is connected in series between the select transistors ST1 and ST2. In the following description, the term "connection" also includes a case where another electrically conductive element is interposed between elements.

In a certain block BLK, gates of the select transistors ST1 of string units SU0 to SU3 are respectively connected to select gate lines SGD0 to SGD3. Moreover, gates of the select transistors ST2 of all the string units SU in the block BLK are commonly connected to a select gate line SGS. Control gates of the memory cell transistors MT0 to MT(2i+1) in the same block BLK respectively are connected to the word lines WL0 to WL(2i+1). That is, the word line WL of the same address is commonly connected to all the string units SU in the same block BLK, and the select gate line SGS is commonly connected to all the string units SU in the same block BLK. On the other hand, a select gate line SGD is connected to only one of the string units SU in the same block BLK.

Among the NAND strings NS arranged in a matrix in the memory cell array 29, the other end of the select transistor ST1 of the NAND string NS in the same row is connected to one of (2m+2) bit lines BL (BL0 to BL(2m+1) (where m is a natural number)). Moreover, the bit line BL is commonly connected to the NAND string NS of the same column across the plurality of blocks BLK.

Moreover, the other end of the select transistor ST2 is connected to a source line CELSRC. The source line CELSRC is commonly connected to the plurality of NAND strings NS across the plurality of blocks BLK.

Data erasing is executed collectively with respect to the memory cell transistors MT in the same block BLK. In contrast, reading and writing of data are executed collectively with respect to the plurality of memory cell transistors MT commonly connected to any of the word lines WL, in any of the string units SU of any block BLK. Such a set of memory cell transistors MT sharing the word line WL in one string unit SU is referred to as a cell unit CU. The cell unit CU is a set of the memory cell transistors MT for which write operations or read operations can be collectively executed.

In addition, one memory cell transistor MT can store a plurality of pieces of bit data, for example. In the same cell unit CU, a set of one bit held at the same bit position by each memory cell transistor MT is called a "page." The "page" is defined as a portion of memory space formed in a set of the memory cell transistors MT in the same cell unit CU.

(Example of Cross-Sectional Structure of Memory Cell Array)

Figure 5:
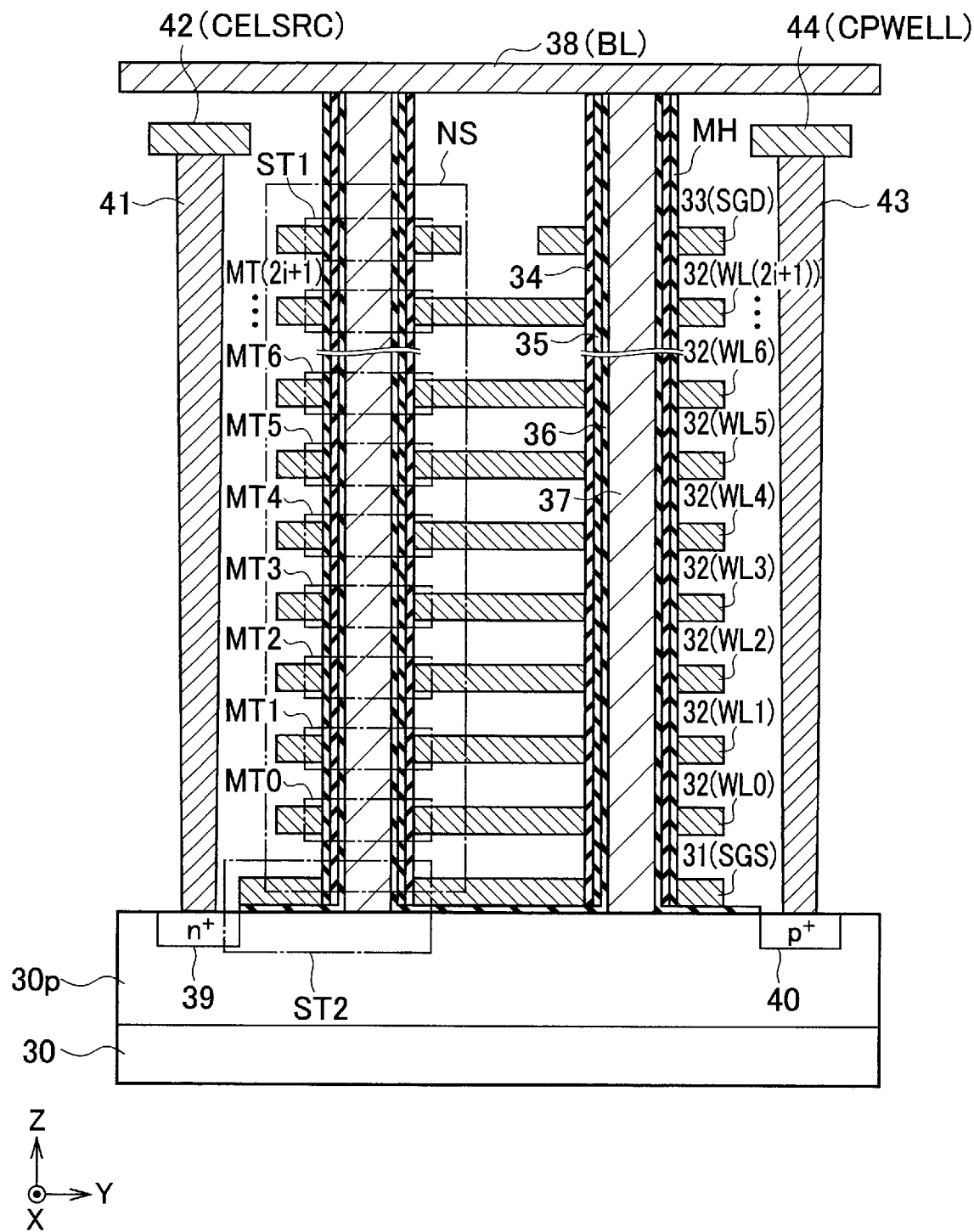
FIG. 5 is a cross-sectional diagram for explaining a configuration of the memory cell array included in the semiconductor memory device according to the first embodiment.

FIG. 5 illustrates an example of a cross-sectional structure of the memory cell array 29 included on the semiconductor memory device 20. FIG. 5 illustrates the portions relating to two string units SU0 and SU1 in one block BLK. Specifically, FIG. 5 illustrates two NAND strings NS of each of the two string units SU0 and SU1, and peripheral portions thereof. A plurality of configurations of the NAND string NS illustrated in FIG. 5 are arranged in an X-direction and a Y-direction. For example, a set of a plurality of NAND strings NS aligned in the X-direction corresponds to one string unit SU.

As illustrated in FIG. 5, the memory cell array 29 is provided on a semiconductor substrate 30. A plane parallel to a surface of the semiconductor substrate 30 (i.e., the surface oriented in the Z-axial direction illustrated in FIG. 5) is defined as an XY plane, and a direction perpendicular to the XY plane is defined as a Z-direction. Further, the X-direction and the Y-direction are orthogonal to each other.

A p type well region 30$p$ is disposed on the semiconductor substrate 30. A plurality of NAND strings NS are disposed on the p type well region 30$p$. More specifically, on the p type well region 30$p$, a wiring layer 31 functioning as the select gate line SGS, (2i+2) wiring layers 32 (WL0 to WL(2i+1)) functioning as word lines WL0 to WL(2i+1), and a wiring layer 33 functioning as the select gate line SGD are sequentially stacked, for example. A plurality of wiring layers 31 and 33 may be stacked thereon. An insulating film (not illustrated) is disposed between the stacked wiring layers 31 to 33.

The wiring layer 31 is commonly connected to the gates of the respective select transistors ST2 of the plurality of NAND strings NS in one block BLK, for example. The wiring layer 32 is commonly connected to control gates of the respective memory cell transistors MT of the plurality of NAND strings NS in one block BLK, for each layer. The wiring layer 33 is commonly connected to the gates of the respective select transistors ST1 of the plurality of NAND strings NS in one string unit SU.

A memory hole MH is disposed so as to pass through the wiring layers 33, 32, and 31 and to reach the p type well region 30$p$. On the side surface of the memory hole MH, a block insulating layer 34, a charge storage layer (e.g., insulating layer) 35, and a tunnel oxide layer 36 are sequentially disposed in this order from outside. A semiconductor pillar (e.g., conductive layer) 37 is embedded in the memory hole MH. The semiconductor pillar 37 is non-doped polysilicon, for example, and functions as a current path of the NAND string NS. On a top edge of the semiconductor pillar 37, a wiring layer 38 functioning as a bit line BL is disposed.

As described above, the select transistor ST2, the plurality of memory cell transistors MT, and the select transistor ST1 are sequentially stacked on the upper side of the p type well region 30*p*, and one memory hole MH corresponds to one NAND string NS.

An n⁺ type impurity diffusion region 39 and a p⁺ type impurity diffusion region 40 are disposed on an upper portion of the p type well region 30*p*. A contact plug 41 is disposed on an upper surface of the n⁺ type impurity diffusion region 39. On an upper surface of the contact plug 41, a wiring layer 42 functioning as a source line CELSRC is disposed. A contact plug 43 is disposed on an upper surface of the p⁺ type impurity diffusion region 40. On an upper surface of the contact plug 43, a wiring layer 44 functioning as a well line CPWELL is disposed.

(Block Configuration Example of Memory Cell Array)

Figure 6:
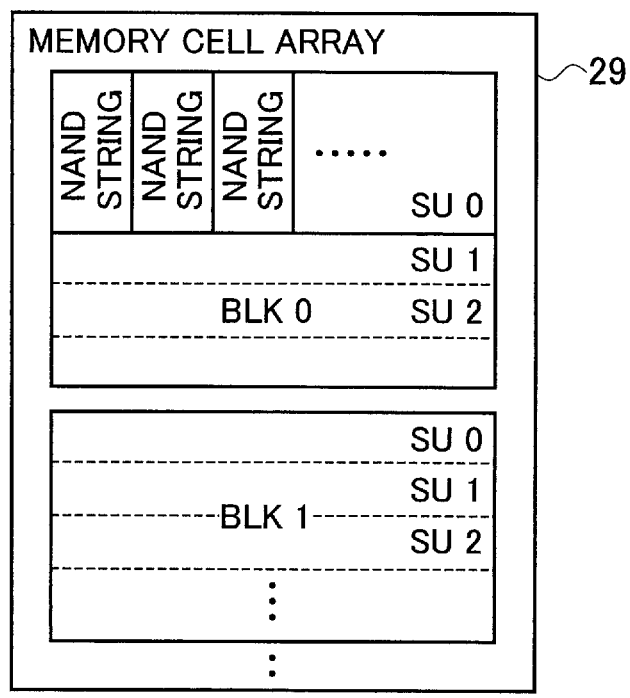
FIG. 6 is a block diagram for explaining a block configuration of the memory cell array included in the semiconductor memory device according to the first embodiment.

As illustrated in FIG. 6, the memory cell array 29 includes a plurality of blocks BLK (BLK0, BLK1, . . . ). The block BLK includes a plurality of nonvolatile memory cell transistors associated with word lines and bit lines. The block BLK is an erasing unit of data, and data in the same block BLK is collectively erased, for example. Each block BLK includes a plurality of string units SU (SU0, SU1, SU2, . . . ). Each string unit SU is a set of NAND strings NS. The NAND string NS includes a plurality of memory cell transistors. Hereinafter, the memory cell transistor may also be simply referred to as a "cell". The number of blocks in the memory cell array 29, the number of string units in one block BLK, and the number of NAND strings in one string unit SU can be set to any number.

(Plane Configuration Example of Memory Cell Array)

Figure 7:
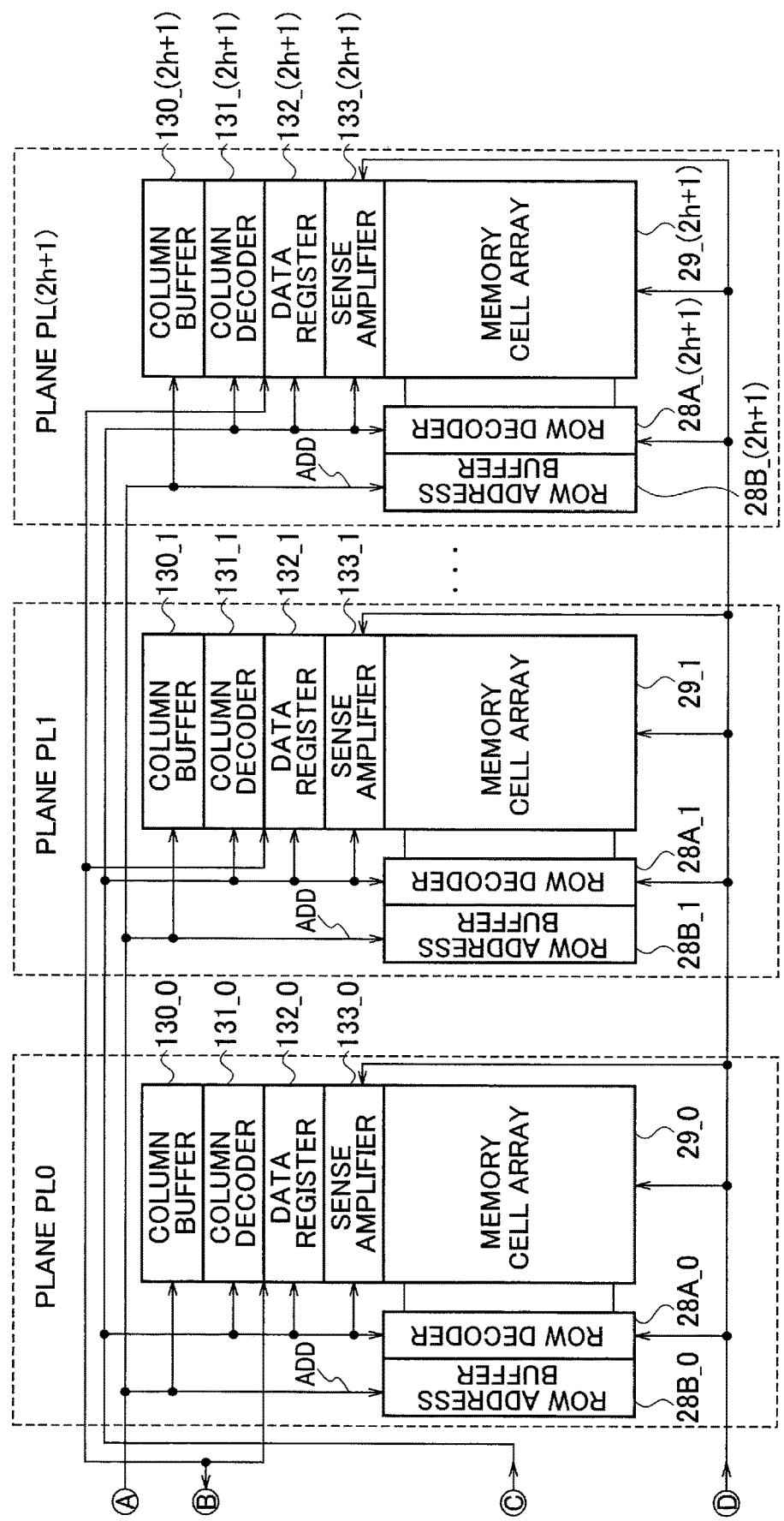
FIG. 7 is a block diagram for explaining a plane configuration of the memory cell array included in the semiconductor memory device according to the first embodiment.

FIG. 7 is a block diagram illustrating a configuration of a plurality of planes of the semiconductor memory device 20. In addition, circled connectors A, B, C, and D illustrated in FIG. 7 are respectively connected to the address register 24A, the I/O circuit 22, the control circuit 23, and the high voltage generation circuit 26 illustrated in FIG. 2.

As illustrated in FIG. 7, the semiconductor memory device 20 includes a plurality of planes PL0 to PL(2h+1) (where h is a natural number). The number of the planes PL0 to PL(2h+1) provided in the semiconductor memory device 20 corresponds to the number of the DQ signals transmitted and received between the semiconductor memory device 20 and the controller 10 (in this case, DQ0 to DQ7). The plurality of planes PL0 to PL(2h+1) respectively include: as mutually-independent peripheral circuits, row decoders 28A_0 to 28A_(2h+1), memory cell arrays 29_0 to 29_(2h+1), column buffers 130_0 to 130_(2h+1), row address buffers 28B_0 to 28B_(2h+1), column decoders 131_0 to 131_(2h+1), data registers 132_0 to 132_(2h+1), and sense amplifiers 133_0 to 133_(2h+1).

The controller 10 can execute an erase process, a write process, or a read process simultaneously for each of the planes PL0 to PL(2h+1). In other words, the controller 10 can operate the respective planes PL0 to PL(2h+1) in parallel. The controller 10 can also execute the erasing process, the write process, and the read process individually for each of the planes PL0 to PL(2h+1). In other words, the controller 10 can execute the write process and the read process in plane units.

The plane PL0 includes the row decoder 28A_0, the memory cell array 29_0, the column buffer 130_0, the column decoder 131_0, the data register 132_0, and the sense amplifier 133_0. The plane PL1 includes the row decoder 28A_1, the memory cell array 29_1, the column buffer 130_1, the column decoder 131_1, the data register 132_1, and the sense amplifier 133_1.

The planes PL2 to PL2*h* are configured in the same manner as the plane PL0 or PL1. The plane PL(2h+1) includes the row decoder 28A_(2h+1), the memory cell array 29_(2h+1), the column buffer 130_(2h+1), the column decoder 131_(2h+1), the data register 132_(2h+1), and the sense amplifier 133_(2h+1).

Each of the memory cell arrays 29_0 to 29_(2h+1) is a storage unit constituted by including a plurality of blocks BLK. The memory cell arrays 29_0 to 29_(2h+1) are respectively connected to the high voltage generation circuit 26, the row decoders 28A_0 to 28A_(2h+1), and the sense amplifiers 133_0 to 133_(2h+1). The data in each block BLK of the memory cell arrays 29_0 to 29_(2h+1) are collectively erased. Each block BLK includes a plurality of cell transistors (memory cell) associated with the bit lines and the word lines. The cell transistor stores write data from the controller 10 in a nonvolatile manner.

The row decoders 28A_0 to 28A_(2h+1) respectively decode the row addresses which specify the row directions of the memory cell arrays 29_0 to 29_(2h+1). The row address buffers 28B_0 to 28B_(2h+1) respectively store temporarily address signals ADD respectively supplied from the address registers 24A and respectively supply the supplied address signals ADD to the row decoders 28A_0 to 28A_(2h+1). Each row decoder 28A_0 to 28A_(2h+1) selects one block BLK on the basis of the address signal ADD supplied from each row decoder 28A_0 to 28A_(2h+1), and transfer the voltage supplied from the high voltage generation circuit 26 to the selected block BLK. The row decoders 28A_0 to 28A_(2h+1) respectively select the word lines corresponding to target cell transistors in which a read operation and a write operation is executed. Each row decoder 28A_0 to 28A_(2h+1) applies desired voltages respectively to a selected word line and a non-selected word line.

The column buffers 130_0 to 130_(2h+1) respectively store column addresses which respectively specify the column directions of the memory cell arrays 29_0 to 29_(2h+1). The column decoders 131_0 to 131_(2h+1) respectively decode the column addresses which respectively specify the column directions of the memory cell arrays 29_0 to 29_(2h+1) respectively stored in the column buffers 130_0 to 130_(2h+1). Depending on to a result of the decoding, when writing data, the data is transferred to the data registers 132_0 to 132_(2h+1), and when reading data, the data is read from the data registers 132_0 to 132_(2h+1).

Each of the data registers 132_0 to 132_(2h+1) temporarily stores the write data or the read data for one page.

When reading the data, the sense amplifiers 133_0 to 133_(2h+1) sense the data read from the memory cell arrays 29_0 to 29_(2h+1), and transfer the sensed data to the data registers 132_0 to 132_(2h+1), respectively. When writing the data, the data stored in the data registers 132_0 to 132_(2h+1) is respectively transferred to the memory cell arrays 29_0 to 29_(2h+1).

(Erase Operation)

In an Electrically Erasable Programmable Read-Only Memory (EEPROM) which is a semiconductor memory device capable of electrically erasing and rewriting data, when a programmed value is changed or when the aforementioned value become needless, an erase operation is executed. In the NAND flash memory, although a program operation is executed in units of the word line WL, an erase operation is executed in predetermined units (e.g., in units of the block BLK in which a plurality of word lines WL are bonded) in order to reduce circuit scales or required time.

The erase operation includes roughly two operations. The first operation is an erase pulse applying operation of applying an erase pulse to a memory cell, and extracting a negative charge (i.e., discharging the negative charge) in the memory cell to reduce a threshold voltage Vth of the memory cell to an erase threshold value. The second operation is an erase verify operation of verifying whether or not the negative charge in the memory cell is extracted on the basis of the change in the threshold voltage Vth. When it is verified that the threshold voltage Vth is decreased to the erase threshold value in the erase verify operation, the erase operation is completed (erase pass). However, when the threshold voltage Vth is not decreased to the desired erase threshold value, the erase pulse is applied to the memory cell again and the erase pulse applying operation and the erase verify operation are repeated until the threshold voltage Vth is decreased to the desired erase threshold value.

The erase verify operation is also executed in predetermined units, such as in units of the block BLK. When threshold voltages Vth of the memory cells of all word lines WL are decreased to the desired erase threshold value, the bit lines BL respectively intersecting the word lines WL are turned to an ON state. On the other hand, when the threshold voltage Vth of at least any one of the word lines WL among the plurality of word lines WL is higher than the erase threshold value, the bit line which intersects the aforementioned word line WL is turned to an OFF state.

Due to characteristics of the memory cells, "cells in which the threshold voltage Vth is hard to be decreased" (hereinafter, also referred to as "abnormal cell") are present at a certain rate. Therefore, when the number of the bit lines in the OFF state is equal to or less than a certain the predetermined value, it is turned to an erase pass state. On the other hand, when the number of the bit lines in the OFF state exceeds the certain the predetermined value, it is turned to an erase fail state. The predetermined value is calculated from results, such as a test, and can be set in advance at the time of shipping or can be set to a selected value by the controller 10 after the shipment. When the predetermined value is set at the time of shipment, the predetermined value is read from a Read-Only Memory (ROM) which is not illustrated. Note that the predetermined value which has been set at the time of shipment is used herein. Moreover, the "threshold voltage Vth is hard to be decreased" means that the threshold voltage Vth is not decreased to the desired erase threshold value within a predetermined time. A current leakage between the word line WL and the bit line BL is one of the causes that the threshold voltage Vth is hard to be decreased. When a current leak path is present between a certain word line WL and a certain bit line BL, since the memory cell of the word line WL cannot be applied with a voltage required for the erase operation state, unerased data remains. Consequently, the threshold voltage Vth may not be decreased to the desired erase threshold value within a predetermined time.

In a flash memory having three-dimensional (3D) stacked structure, as the stacked number is increased the number of word lines WL intersecting with the bit lines BL is increased and the memory capacity per unit area is increased, but the number of bit lines BL which are turned to the OFF state is also increased in the erase verify operation. In this case, it is necessary to further apply the erase pulse thereto until the threshold voltage Vth of the abnormal cell is decreased to the desired erase threshold value. At this time, since the erase pulse is also applied to a cell (hereinafter, also referred to as "normal cell") having an appropriate threshold voltage Vth, there is concern that the reliability of the memory cell is reduced.

Herein, therefore, a target range (e.g., block BLK) to which the erase verify operation is subjected is divided into a plurality of groups, a voltage (Vread) exceeding a gate threshold voltage is applied to a non-target group of the erase verify operation so that the non-target group is in a normally ON state. Consequently, the number of bit lines BL which are turned to the OFF state can be reduced, and the speed and accuracy of the erase verify operation can be ensured. Moreover, as the stacked number is increased, it becomes difficult to flow the current through the bit line BL. However, since word lines WL which are the target of the erase verify operation can be reduced by dividing the target range into predetermined groups, it becomes easy to ensure the current of the bit line BL.

Moreover, although the abnormal cell affects the read characteristics after the program operation, if the abnormal cells are distributed, it is possible to correct an error by functions, such as error correction, so that there is no practical problem. However, when abnormal cells are concentrated in a certain specific range (area), a read error occurs, exceeding the capability of the error correction.

Therefore, the present embodiment provides a semiconductor memory device and a memory state detecting method, each capable of detecting concentration of abnormal cells in a certain range (area) in a short time.

The semiconductor memory device and the memory state detecting method according to the present embodiment change a method of the erase verify operation executed for each bit line in semiconductor memory devices, such as a flash memory, in addition to a semiconductor process, and thereby it is possible to detect a current leak due to a defect or degradation which occur in a memory cell in a short time. In this context, the defect of degradation which occurs in the memory cell corresponds to a memory state in which the volume of remaining of unerased data is equal to or greater than a predetermined reference value after the data of the NAND flash memory is erased, for example.

(Even Word Line/Odd Word Line Selection Mode)

In the present embodiment, although the erase operation is executed in units of the block BLK in which a plurality of word lines WL are bound, an erase target block BLK is divided into a plurality of ranges (groups) and the erase verify operation is executed for each group in order to detect an occurrence of concentration of abnormal cells in a short time.

Figure 8:
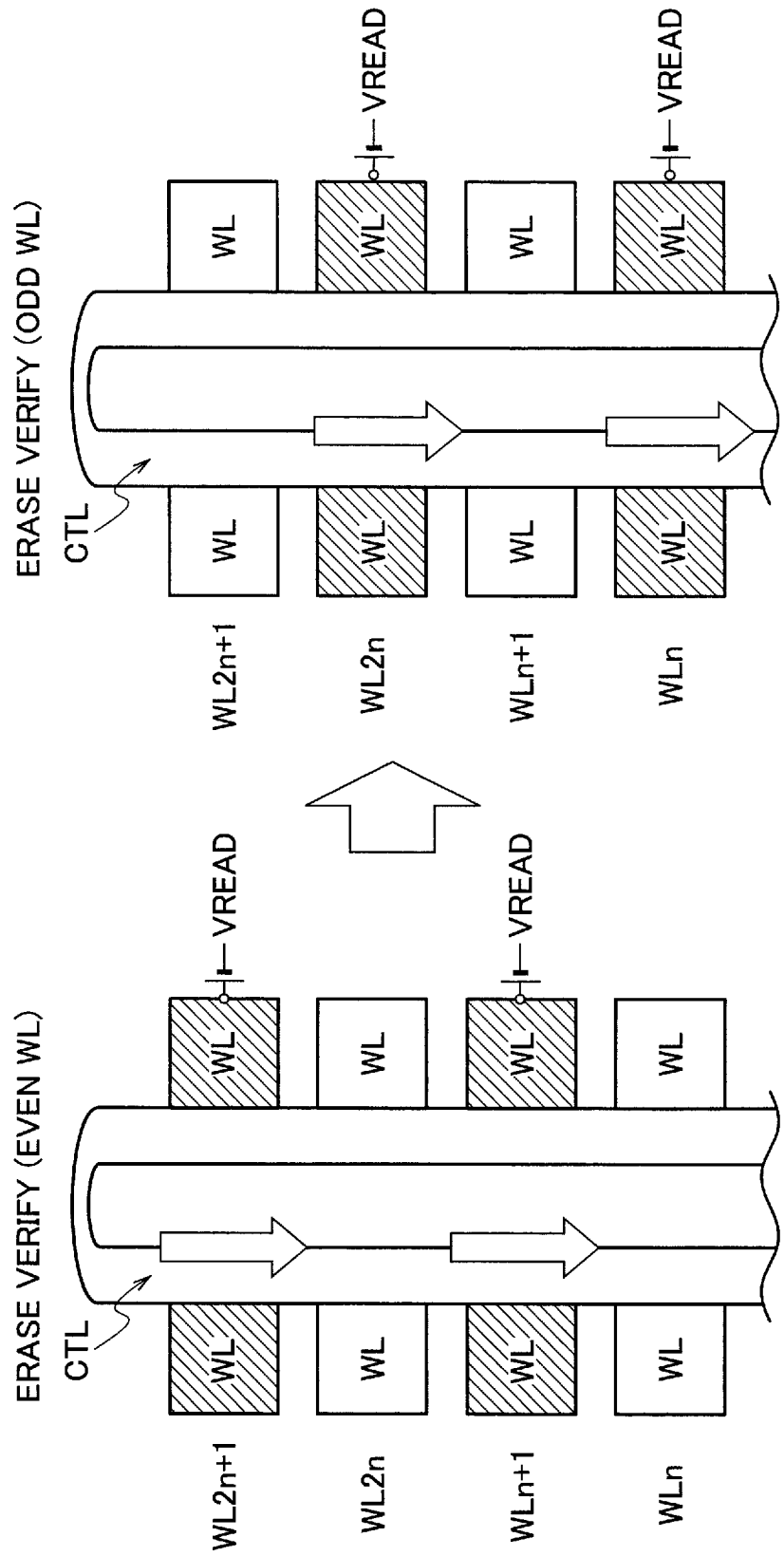
FIG. 8 is a schematic diagram for explaining the operation which executes an erase verification by means of an even word line/odd word line selection mode in the semiconductor memory device according to the first embodiment.

More specifically, as illustrated in FIG. 8, the erase target block BLK is divides into a group of even-numbered word lines (even WL) and a group of odd-numbered word lines (odd WL) and the erase pulse applying operation and the erase verify operation are executed. In an example illustrated in FIG. 8, word lines WLn and WL2n are included in the even WL group, and word lines WL(n+1) and WL(2n+1) are included in the odd WL group. Herein, as the "odd-numbered word lines (odd WL)" and the "even-numbered word lines (even WL)", odd-numbered word lines WL0, WL2, WL4, WL6, . . . are the "odd-numbered word lines (odd WL)" and even-numbered word lines WL1, WL3, WL5, . . . are the even number WL, by counting the word limes from the select gate line SGS side of the select transistor ST2 illustrated in FIG. 4, for example. However, the definition of the odd WL and the even WL is not limited to such an example. For example, counting from the select gate line SGD0 side of the select transistor ST1, the odd-numbered word lines may be used as the odd WL, and the even-numbered word lines may be used as the even WL.

As illustrated in FIG. 8, while the erase verify operation is executed for the even WL, a voltage (Vread) exceeding the gate threshold voltage is applied to the odd WL so that the odd WL is in the normally ON state, and while the erase verify operation is executed for the odd WL, the voltage (Vread) is applied to the even WL so that the even WL is in the normally ON state. Consequently, the number of bit lines BL which are turned to the OFF state can be reduced, and thereby the speed and accuracy of the erase verify operation can be ensured. Moreover, as the stacked number is increased, it becomes difficult to flow the current through the bit line BL. However, since word lines WL which are the target of the erase verify operation can be reduced by dividing the target range into predetermined groups, it becomes easy to ensure the current of the bit line BL.

(Erase Verify Operation)

Figure 9:
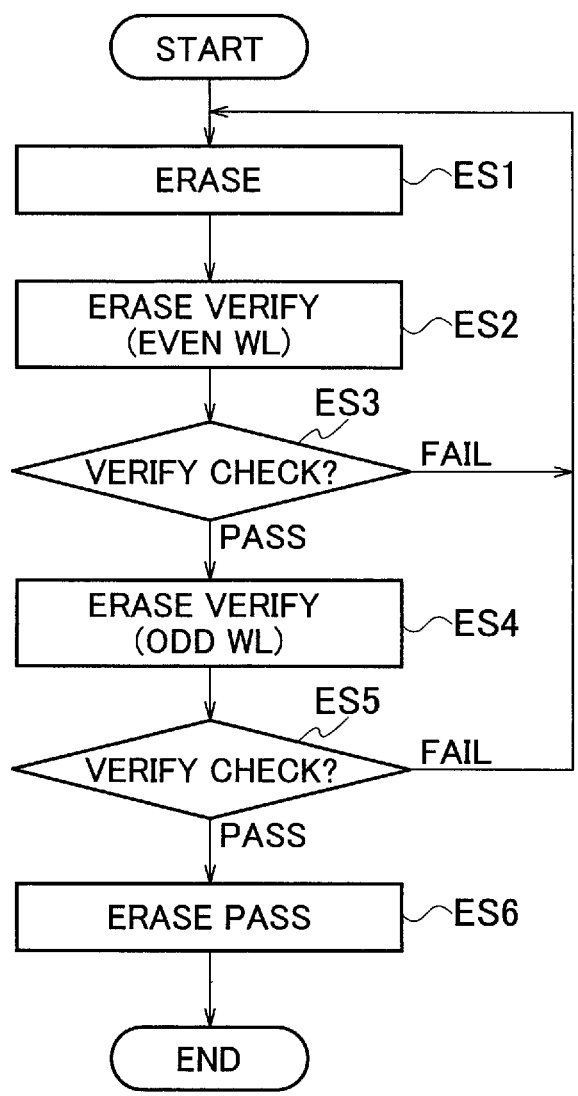
FIG. 9 is a flow chart for explaining an operation of executing an erase verification by means of an even word line/odd word line selection mode in the semiconductor memory device according to the first embodiment.
Figure 11:
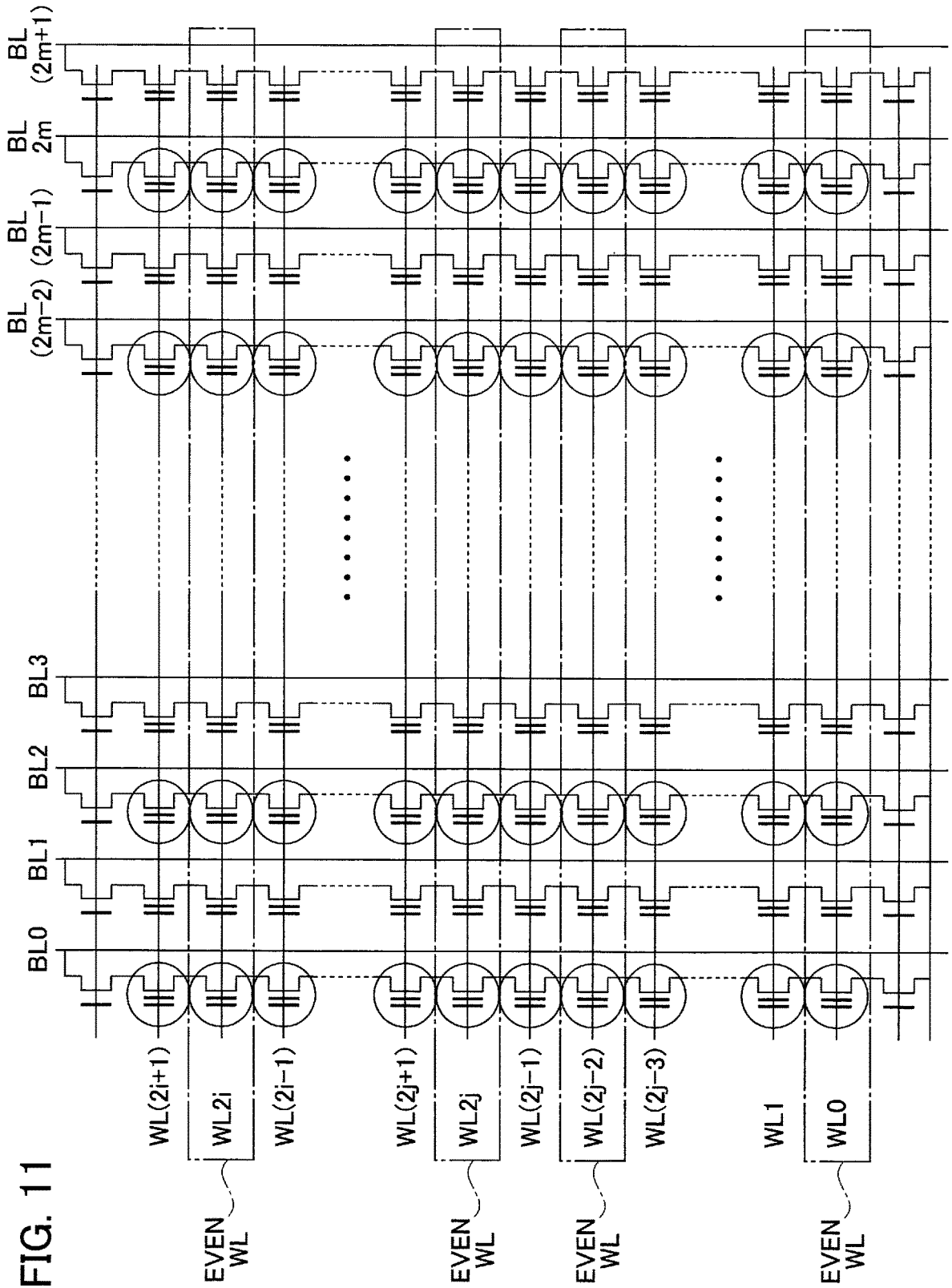
FIG. 11 is an explanatory diagram of even word lines in a circuit configuration of one block of the semiconductor memory device according to the first embodiment.
Figure 12:
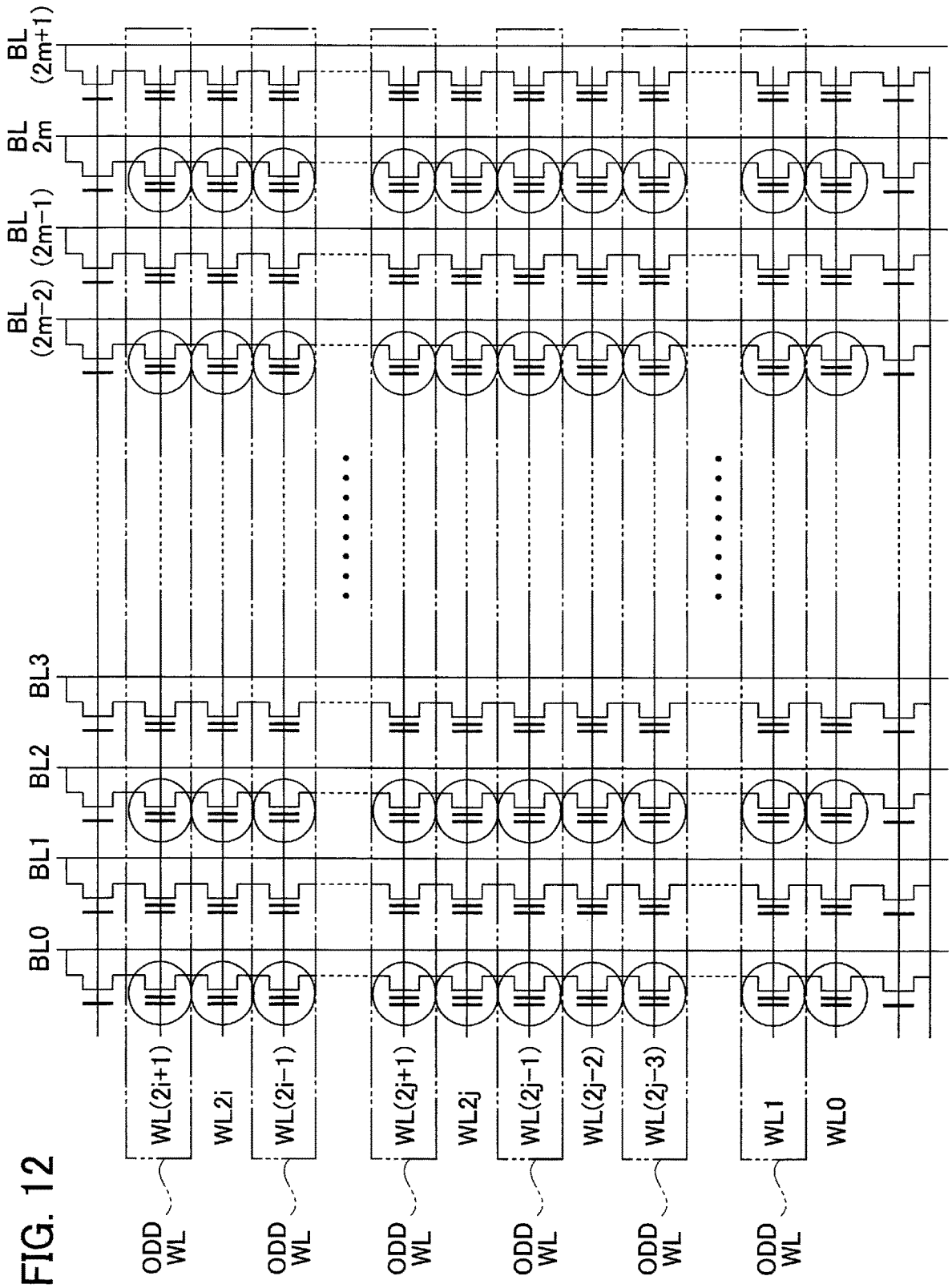
FIG. 12 is an explanatory diagram of odd word lines in the circuit configuration of one block of the semiconductor memory device according to the first embodiment.

FIG. 9 illustrates an operation example of the erase verification according to the even word line/odd word line selection mode in the present embodiment. In the present embodiment, the word lines WL0, . . . , WL(2j−2), WL2j, . . . , WL2i are included in the group of the even-numbered word lines (even WL), as illustrated in FIG. 11, and the word lines WL1, . . . , WL(2j−3), WL(2j−1), WL(2j+1), . . . , WL(2i−1), and WL(2i+1) are included in the group of the odd-numbered word lines (odd WL), as illustrated in FIG. 12. The Bit lines BL0, BL1, BL2, BL3, . . . , BL(2m−2), BL(2m−1), BL2m, and BL(2m+1) respectively intersect the word lines WL illustrated in FIGS. 11 to 12, and memory cells are respectively disposed at the intersection portions.

As illustrated in FIG. 9, in Step ES1, in order to extract a negative charge in each memory cell (i.e., threshold voltage Vth of the memory cell is decreased to the erase threshold value), the erase pulse is applied for the erase target blocks BLK.

In Step ES2, the control circuit 23 executes the erase verify operation for the even WL group. More specifically, it is verified whether or not the negative charge in the memory cell of the even WL group is extracted on the basis of the change of the threshold voltage Vth. When threshold voltages Vth of the memory cells of all word lines WL of the even WL group are decreased to the desired erase threshold value, the bit lines BL respectively intersecting the word lines WL are turned to an ON state. On the other hand, when the threshold voltage Vth of at least any one of the word lines WL among the plurality of word lines WL is higher than the erase threshold value, the bit line which intersects the aforementioned word line WL is turned to an OFF state.

In Step ES3, when the number of the bit lines being in the OFF state exceeds a predetermined value, the even WL group is turned to an erase fail state, and returning to Step ES1, the erase pulse is again applied to the memory cell, and the erase verify operation of Steps ES2 to ES3 is executed (erase loop).

In contrast, in Step ES3, when all the bit lines are in the OFF state or the number of the bit lines being in the OFF state is equal to or less than the predetermined value, the even WL is turned to an erase pass state, and then it proceeds to the erase verify operation for the odd WL group.

In Step ES4, the control circuit 23 executes the erase verify operation for the odd WL group, and verifies whether or not the negative charge in the memory cell is extracted on the basis of the change of the threshold voltage Vth. When threshold voltages Vth of the memory cells of all word lines WL of the odd WL group are decreased to the desired erase threshold value, the bit lines BL respectively intersecting the word lines WL are turned to an ON state. On the other hand, when the threshold voltage Vth of at least any one of the word lines WL among the plurality of word lines WL is higher than the erase threshold value, the bit line which intersects the aforementioned word line WL is turned to an OFF state.

In Step ES5, when the number of the bit lines being in the OFF state exceeds a predetermined value, the odd WL group is turned to an erase fail state, and returning to Step ES1, the erase pulse is again applied to the memory cell, and the erase verify operation of Steps ES4 to ES5 is executed (erase loop).

In contrast, in Step ES5, when all the bit lines are in the OFF state or the number of the bit lines being in the OFF state is equal to or less than the predetermined value, the odd WL is turned to an erase pass state, and in Step ES6, the erase operation of the erase target block BLK is completed (erase pass state).

(Memory State Detecting Method)

Figure 10:
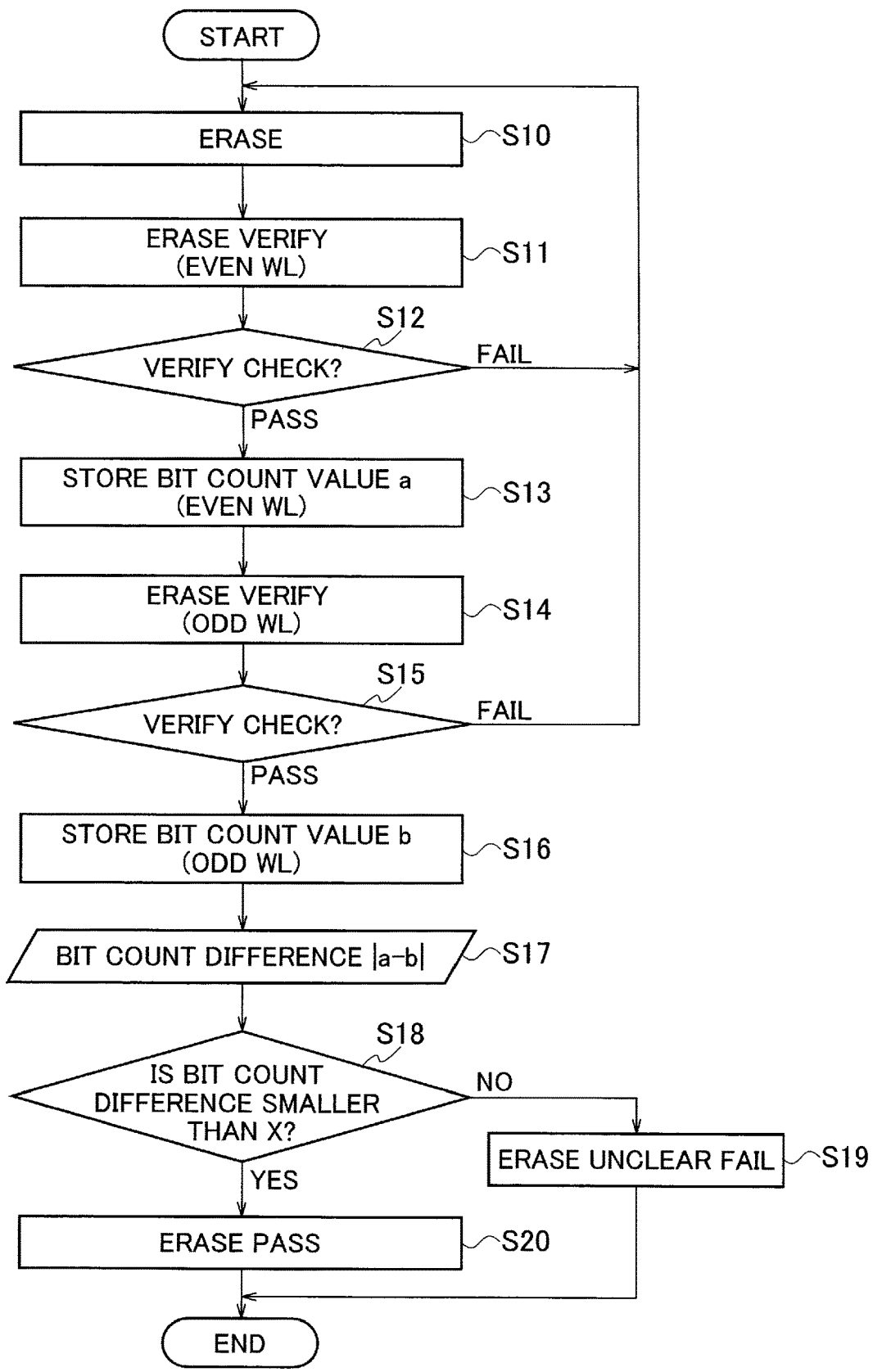
FIG. 10 is a flow chart for explaining a memory state detecting method when the erase verification is executed by means of the even word line/odd word line selection mode in the semiconductor memory device according to the first embodiment.

FIG. 10 illustrates a flow chart for explaining a memory state detecting method when the erase verification is executed by means of the even word line/odd word line selection mode in the semiconductor memory device according to the present embodiment.

The processing operations of Steps S10, S11, S12, S14, and S15 are similar to the processing operations of Steps ES1, ES2, ES3, ES4, and ES5 illustrated in FIG. 9, and thus detailed description thereof is omitted.

In Step S10, the erase pulse is applied to the erase target block BLK. Subsequently, in Steps S11 to S12, the erase verify operation is executed for the even WL group (the word lines WL0, . . . WL(2j−2), WL2j, . . . , WL2i in the example of FIG. 11).

Herein, an erase verify fail flag VFF indicating a state of the bit line which intersects the even word lines WL in which the erase verify operation is executed is loaded, for example for one page in the data register 132. In the erase verify operation of Step S11, "0" (flag OFF) is set to the erase verify fail flag VFF of the bit line BL which is in the ON state, and "1" (flag ON) is set to erase verify fail flag VFF of bit line BL which was in the OFF state.

After completion of the erase verify operation for the even WL group in Steps S11 to S12, in Step S13, the erase verify fail flags VFF in the data register 132 are read, and the number of the bit lines BL which are in the OFF state in the even WL group is counted, and the counted value (bit count value a) is stored in one counter register 234 of the plurality of the counter registers (234 and 235) in the control circuit 23. The counter 231 in the control circuit 23 receives the erase verify fail flags VFF from the data register 132, counts the number of the erase verify fail flags VFF of which the value is "1" (flag ON)" among the received erase verify fail flags VFF, and stores the counted result as a count value CNT1 in the counter register 234. That is, by counting the number of the erase verify fail flags VFF of which the value is "1" (flag ON)", the number of the bit lines BL being turned to the OFF state in the erase verify operation for the even WL group in Steps S11 to S12 is calculated and stored in the counter register 234.

Similarly, in Steps S14 to S15, the erase verify operation is executed for the odd WL group (WL1, . . . , WL(2j−3), WL(2j−1), WL(2j+1), . . . , WL(2i−1), WL(2i+1) in the example of FIG. 12).

Herein, the erase verify fail flag VFF indicating a state of the bit line which intersects the odd word lines WL in which the erase verify operation is executed is loaded, for example for one page in the data register 132. In the erase verify operation of Step S14, "0" (flag OFF) is set to the erase verify fail flag VFF of the bit line BL which is in the ON state, and "1" (flag ON) is set to erase verify fail flag VFF of bit line BL which was in the OFF state.

After completion of the erase verify operation for the odd WL group in Steps S14 to S15, in Step S16, the erase verify fail flags VFF in the data register 132 are read, and the number of the bit lines BL which are in the OFF state in the odd WL group is counted, and the counted value (bit count value b) is stored in the other counter register 235 of the plurality of the counter registers (234 and 235) in the control circuit 23. The counter 231 in the control circuit 23 receives the erase verify fail flags VFF from the data register 132, counts the number of the erase verify fail flag VFF of which the value is "1" (flag ON)" among the received erase verify fail flags VFF, and stores the counted result as a count value CNT2 in the counter register 235. That is, by counting the number of the erase verify fail flags VFF of which the value is "1" (flag ON)", The number of the bit lines BL being turned to the OFF state in the erase verify operation for the odd WL group in Steps S14 to S15 is calculated and stored in the counter register 235.

Next, in Step S17, the arithmetic circuit 236 in the control circuit 23 takes a difference (|bit count value a−bit count value b|) between a plurality of the count values CNT1 and CNT2 respectively stored in the plurality of the counter registers (234 and 235), and outputs the difference result as the number of second fail flags FC2.

Next, in Step S18, the comparator 237 in the control circuit 23 compares the number of the first fail flags FC1 stored in the criteria register 232 in the control circuit 23 with the number of the second fail flags FC2 output from the arithmetic circuit 236, and detects a memory state on the basis of the comparison result to be output as a detected result (to be returned to the status register 24S). The criteria register 232 stores criteria (the number of criteria) of fail flags which is set in advance as the number of first fail flags FC1.

As a result of comparing the number of first fail flags FC1 with the number of second fail flags FC2, when the number of second fail flags FC2 is equal to or less than the number of first fail flags FC1, the comparator 237 completes the erase operation (erase pass state) and returns a flag indicating erase success to the status register 24S, for example, in Step S20.

On the other hand, as a result of comparing the number of first fail flags FC1 with the number of second fail flags FC2, when the number of second fail flags FC2 is larger than the number of first fail flags FC1, the comparator 237 determines that there may be a location where concentration of abnormal cells occurs somewhere in the erase target block BLK, and in Step S19, returns the fact that an abnormality is detected (e.g., a flag indicating an erase failure) to the status register 24S. That is, the case where the number of second fail flags FC2 is larger than the number of first fail flags FC1 corresponds to a case where the difference between the count values CNT1 and CNT2 (|bit count value a−bit count value b|) is relatively large, and thereby it can be determined that there may be a location where concentration of abnormal cells occurs somewhere in the erase target block BLK.

Then, the I/O circuit 22 returns the flag indicating the erase success or the flag indicating the erase failure stored in the status register 24S to the host device. The host device which receives the flag indicating the erase failure prohibits subsequent accesses (a write operation, a read operation, an erase operation, etc.) for the block BLK, for example.

According to the present embodiment, when abnormal cells are concentrated in a certain specific range (area), the concentration of the abnormal cells can be detected in a short time. In particular, since it can be considered that the abnormal cells concentrated in a certain specific word line WL are highly possible to be a memory state, such as stress degradation, such as a current leak, and defects, the read error can be reduced by prohibiting access to the block BLK hereafter.

According to the present embodiment, since the concentration of the abnormal cells in a certain specific word line WL can be detected, a failure mode due to leak between single word line WL and the memory hole MH as illustrated in FIG. 5 can be detected.

Moreover, detecting the memory state during the write operation (program operation) or read operation to the memory cell may lead to data loss, since the memory state is detected during the erase operation in the present embodiment, there is no risk of data loss.

According to the present embodiment, since the erase verification according to the even word line/odd word line selection mode is realized, the quality of the erase verify operation can be compared and distinguished between the even word lines and the odd word lines.

In the conventional erase verification, it is verified for each one word line WL whether or not the erase operation is completed. Therefore, in the case of the three-dimensional flash memory, for example, using the 96-layer stacked layer process, the verification is required 96 times. On the other hand, in the present embodiment, it is only necessary to verify once per group. Accordingly, for example, in the case of the even/odd selection mode of the word lines, it only needs to be verified twice, once for the even WL group and once for the odd WL group. Therefore, according to the present embodiment, there can be provided the semiconductor memory device and the memory state detecting method, each capable of detecting a current leak due to a defect or degradation which occurs in a memory cell in a shorter time than the conventional memory state detecting method.

Second Embodiment (Upper Word Line/Lower Word Line Selection Mode of Word Lines)

In the second embodiment, the word lines WL in the erase target block BLK are divided into a group of upper word lines (UWL) and a group of lower word lines (LWL), the erase verify operation is executed for each group to detect a concentration of abnormal cells in a certain specific word line WL.

Figure 15:
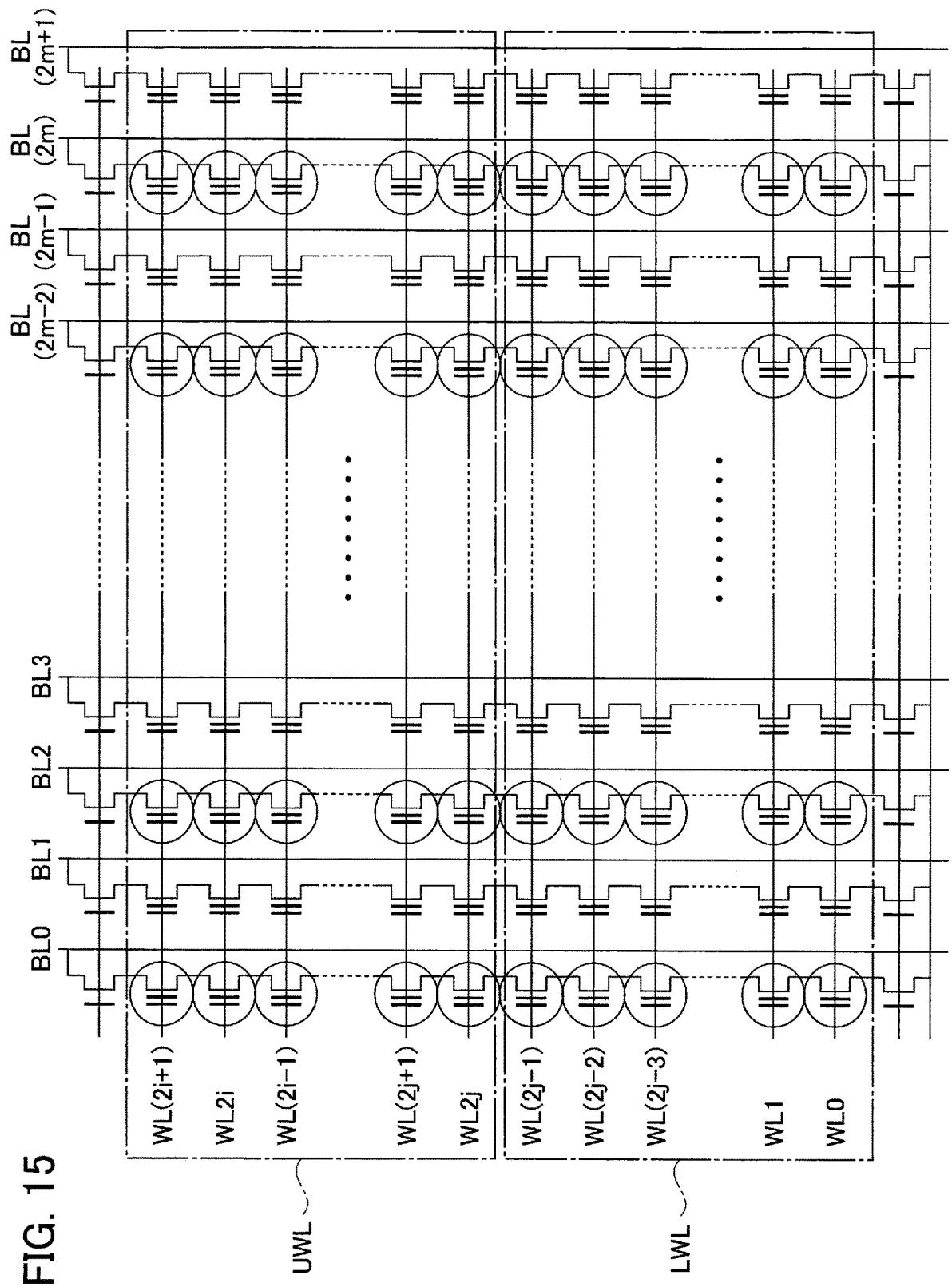
FIG. 15 is an explanatory diagram of a memory cell group connected to the upper word lines and the lower word lines in the circuit configuration of the one block of the semiconductor memory device according to the second embodiment.

FIG. 15 illustrates an explanatory diagram of a memory cell group connected to the upper word lines and the lower word lines in the circuit configuration of the one block of the semiconductor memory device according to the present embodiment. In the example illustrated in FIG. 15, the word lines WL0, WL1, . . . , WL(2j−3), WL(2j−2), and WL (2j−1) are included in the group of the lower word lines (LWL), and the word lines WL2j, WL(2j+1), . . . , WL(2i−1), WL2i, and WL(2i+1) are included in the group of the upper word lines (UWL). The Bit lines BL0, BL1, BL2, BL3, . . . , BL(2m−2), BL(2m−1), BL2m, and BL(2m+1) respectively intersect the word lines WL illustrated in FIG. 15, and memory cells are respectively disposed at the intersection portions. Herein, as the "lower word lines (LWL)" and the "upper word lines (UWL)", for example, the group of word lines WL closer to the select gate line SGS side illustrated in FIG. 4 is used as the "lower word lines (LWL)", and the group of word lines WL closer to the select gate line SGD0 side is used as the "upper word lines (UWL)." However, the definition of the "lower word lines (LWL)" and the "upper word lines (UWL)" is not limited to such an example. For example, the group of the word lines WL closer to the select gate line SGS side may be used as the "upper word lines (UWL)", and the group of the word lines WL closer to the select gate line SGD0 side of select transistor ST1 may be used as the "lower word lines (LWL)."

Figure 13:
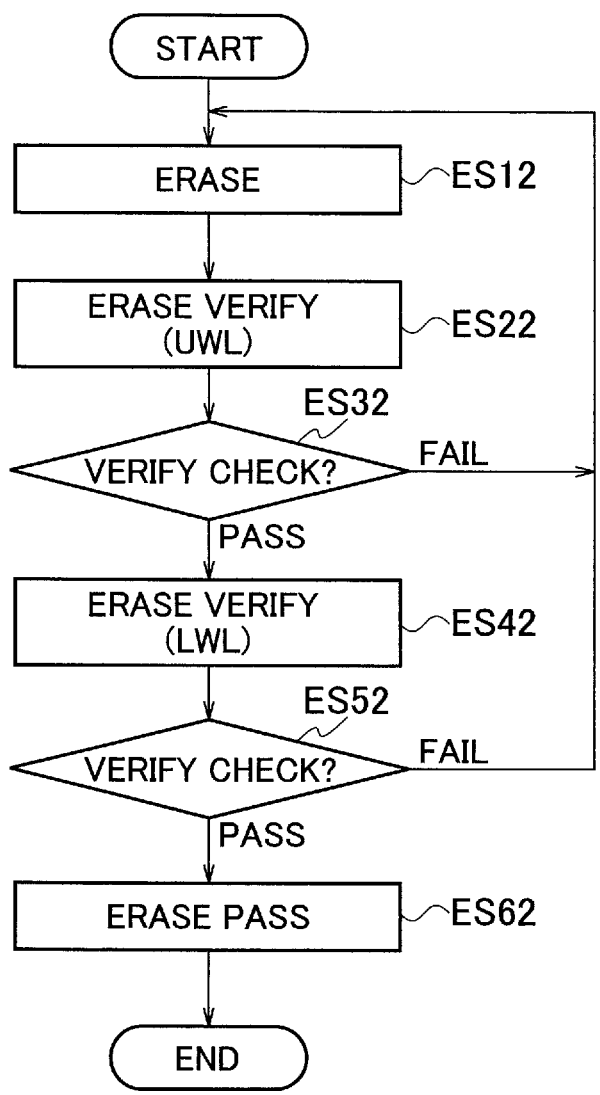
FIG. 13 is a flow chart for explaining an operation of executing an erase verification by means of an upper word line/lower word line selection mode of word lines in the semiconductor memory device according to the second embodiment.
Figure 14:
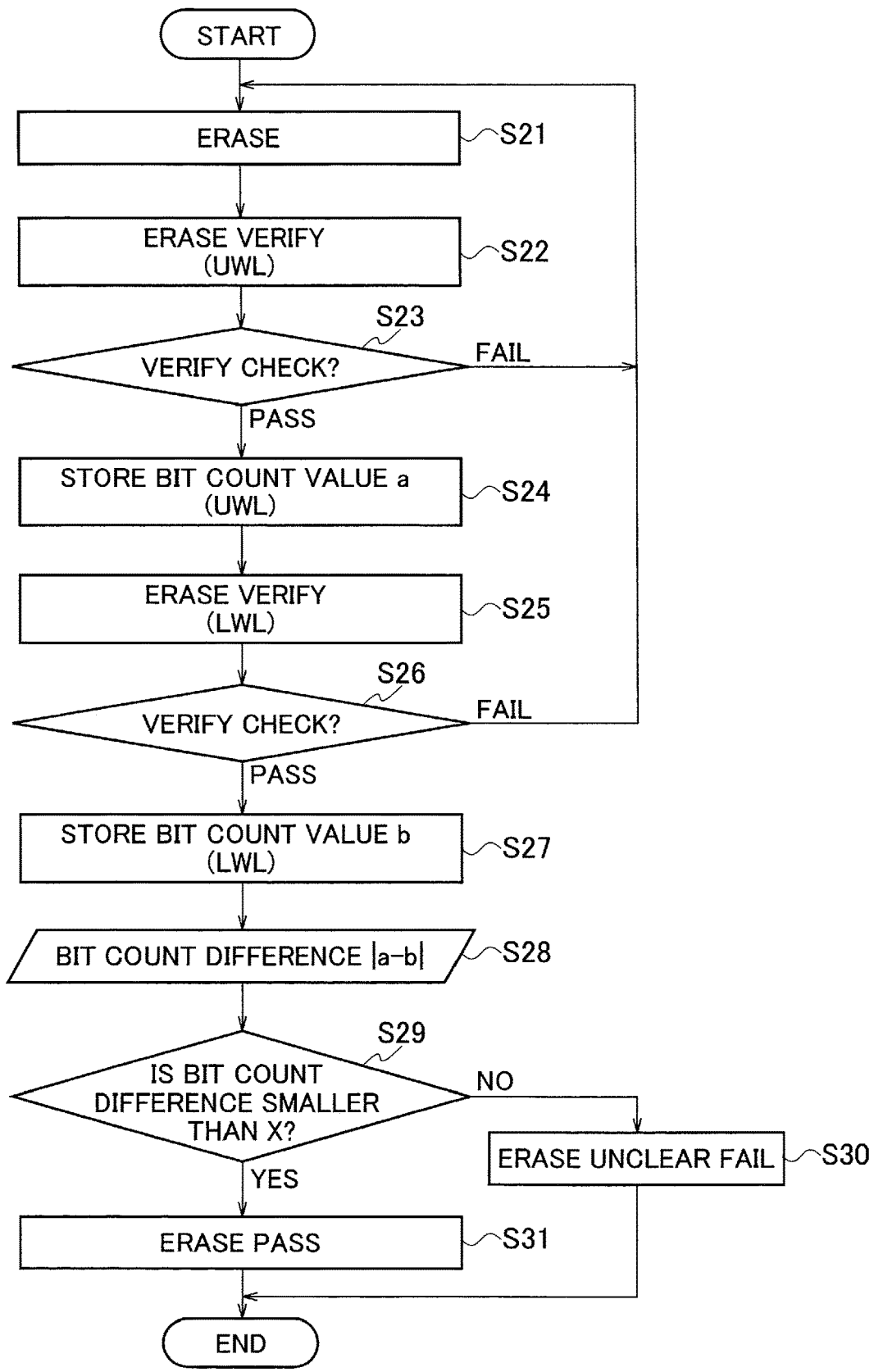
FIG. 14 is a flow chart for explaining a memory state detecting method when the erase verification is executed by means of the upper word line/lower word line selection mode of word lines in the semiconductor memory device according to the second embodiment.

Moreover, in the semiconductor memory device according to the present embodiment, FIG. 13 illustrates an operation example of the erase verification according to the upper word line/lower word line selection mode, and FIG. 14 illustrates a memory state detecting method when the erase verification is executed by means of the upper word line/lower word line selection mode.

The processing operations in Steps ES12, ES22, ES32, ES42, ES52, and ES62 illustrated in FIG. 13 respectively correspond to the processing operations in Steps ES1, ES2, ES3, ES4, ES5, and ES6 illustrated in FIG. 9. In FIG. 13, the erase verify operations in Steps ES22 and ES32 are erase verify operations for the group of the upper word lines (UWL), and the erase verify operations in Steps ES42 and ES52 are erase verify operations for the group of the lower word lines (LWL). As the rest of processing operations, the same processing operation as each step illustrated in FIG. 9 is executed.

Similarly, the processing operations in Steps S21, S22, S23, S24, S25, S26, S27, S28, S29, S30, and S31 illustrated in FIG. 14 respectively correspond to the processing operations in Steps S10, S11, S12, S13, S14, S15, S16, S17, S18, S19, and S20 illustrated in FIG. 10. In FIG. 14, the erase verify operations in Steps S22 to S23 are erase verify operations for the group of the upper word lines (UWL), and the erase verify operations in Steps S25 to S26 are erase verify operations for the group of the lower word lines (LWL). As the rest of processing operations, the same processing operation as each step illustrated in FIG. 10 is executed.

According to the present embodiment, the same effect as that of the first embodiment can be obtained.

Moreover, according to the present embodiment, since the erase verification according to the upper word line/lower word line selection mode is realized, the quality of the erase verify operation can be compared and distinguished between the upper word lines and the lower word lines.

Third Embodiment (Even String/Odd String Selection Mode of Memory Strings)

In the third embodiment, a NAND string NS in the erase target block BLK is divided into a group of even strings (EVEN ST) and a group of odd strings (ODD ST), and the erase verify operation is executed for each group to detect a concentration of abnormal cells in a certain specific NAND string NS.

Figure 18:
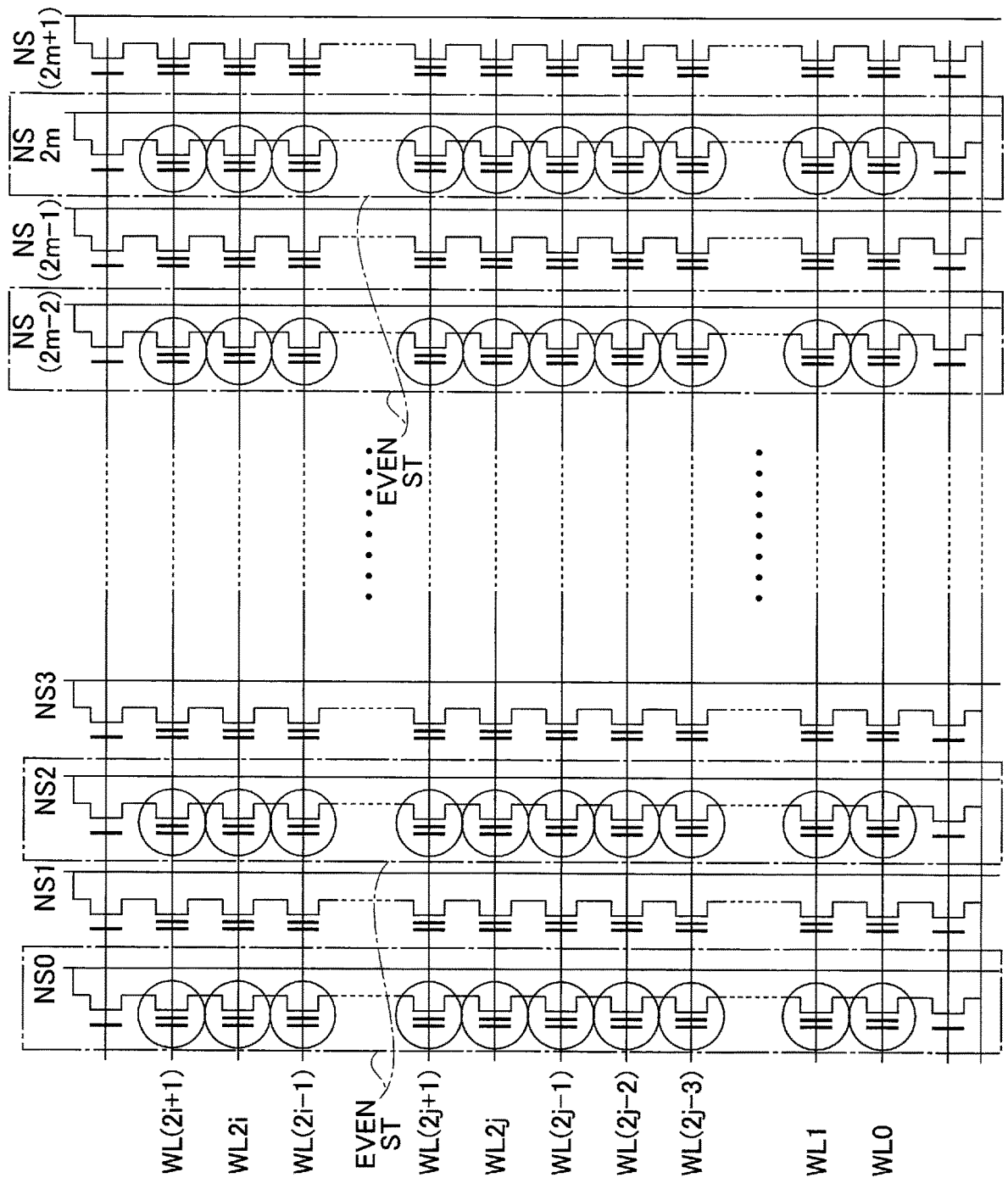
FIG. 18 is an explanatory diagram of even strings in a circuit configuration of one block of the semiconductor memory device according to the third embodiment.
Figure 19:
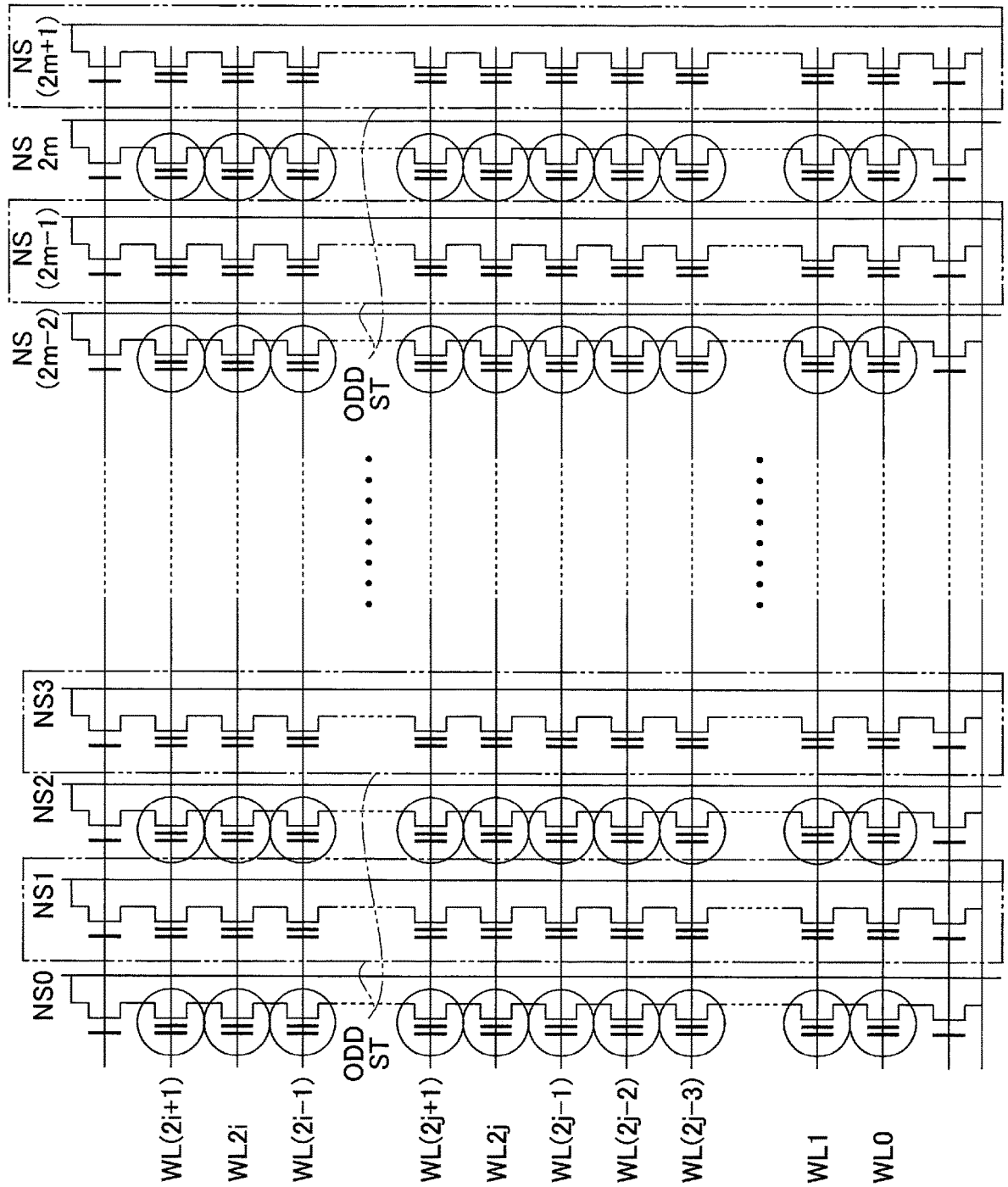
FIG. 19 is an explanatory diagram of odd strings in a circuit configuration of one block of the semiconductor memory device according to the third embodiment.

In the circuit configuration of one block BLK of the semiconductor memory device according to the present embodiment, the group of even strings (EVEN ST) is shown as illustrated in FIG. 18, and the group of odd strings (ODD ST) is shown as illustrated in FIG. 19. In the example illustrated in FIG. 18, the NAND strings NS0, NS2, . . . , NS(2m−2), and NS2m are included in the group of even strings (EVEN ST), and in the example illustrated in FIG. 19, the NAND strings NS1, NS3, . . . , NS(2m−1), and NS(2m+1) are included in the group of odd strings (ODD ST). The word lines WL0, WL1, . . . , WL(2j−3), WL(2j−2), WL(2j−1), WL2j, WL(2j+1), . . . , WL(2i−1), WL2i, and WL(2i+1) respectively intersect the NAND strings NS illustrated in FIGS. 18 to 19, and memory cells are respectively disposed at the intersection portions.

Figure 16:
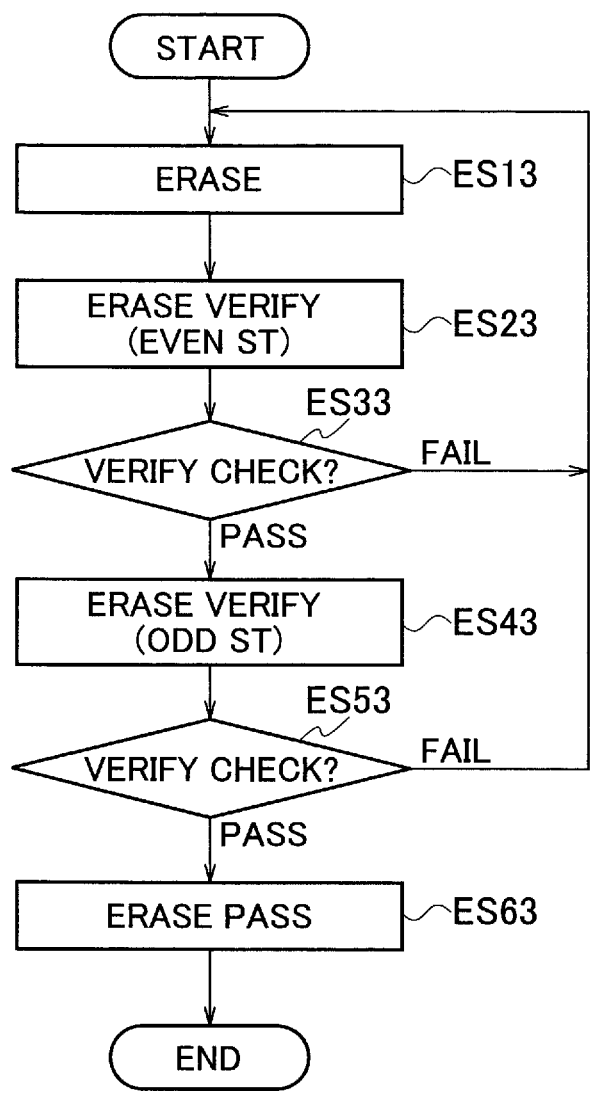
FIG. 16 is a flow chart for explaining an operation of executing an erase verification by means of an even string/odd string selection mode of memory strings in the semiconductor memory device according to the third embodiment.
Figure 17:
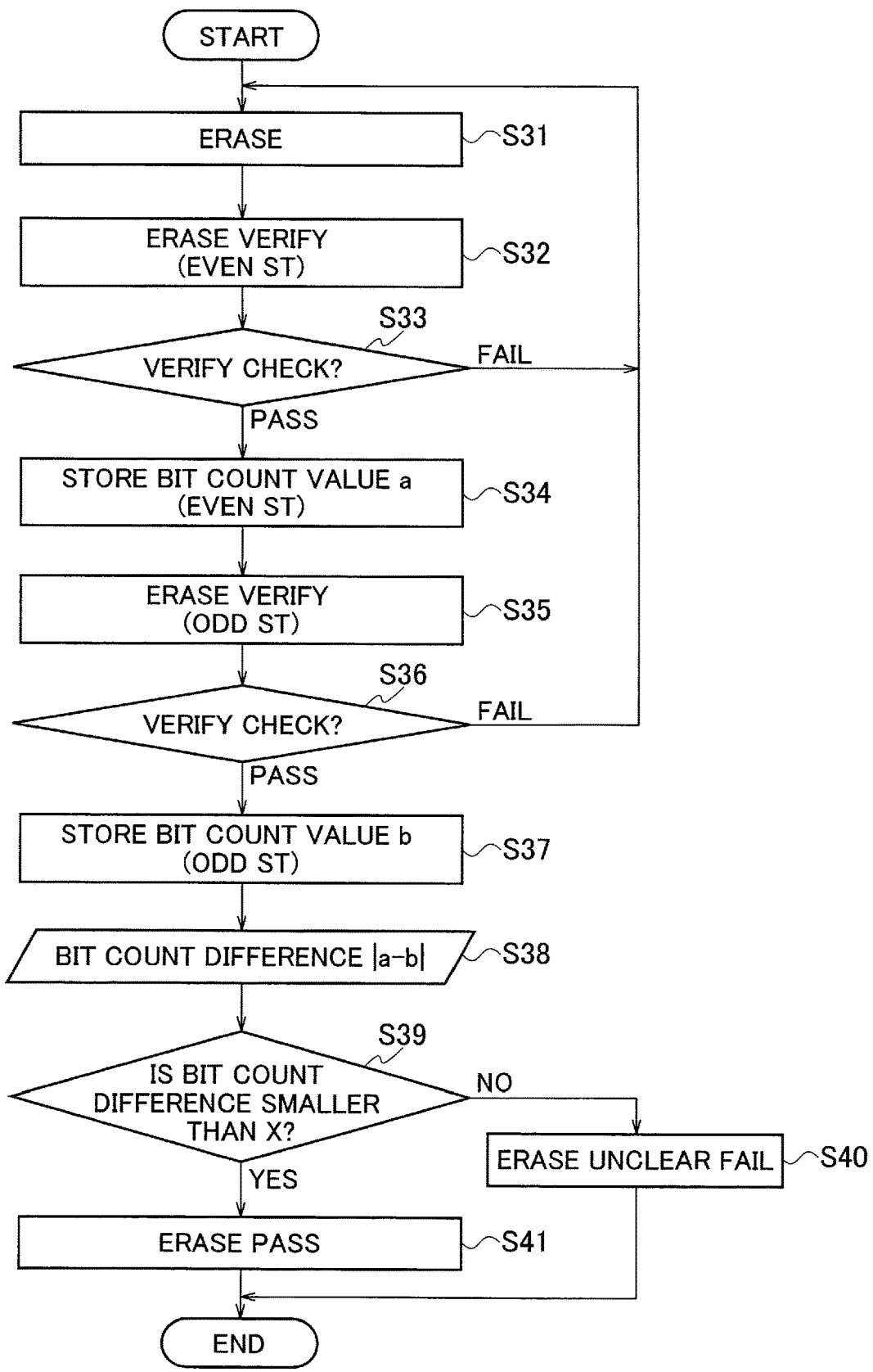
FIG. 17 is a flow chart for explaining a memory state detecting method when the erase verification is executed by means of the even string/odd string selection mode of memory strings in the semiconductor memory device according to the third embodiment.

Moreover, in the semiconductor memory device according to the present embodiment, FIG. 16 illustrates an operation example of the erase verification according to the even string/odd string selection mode of memory strings, and FIG. 17 illustrates an example of a memory state detecting method when the erase verification is executed by means of the even string/odd string selection mode of memory strings.

The processing operations in Steps ES13, ES23, ES33, ES43, ES53, and ES63 illustrated in FIG. 16 respectively correspond to the processing operations in Steps ES1, ES2, ES3, ES4, ES5, and ES6 illustrated in FIG. 9. In FIG. 16, the erase verify operations in Steps ES23 and ES33 are erase verify operations for the group of even strings (EVEN ST), and the erase verify operations in Steps ES43 and ES53 are erase verify operations for the group of odd strings (ODD ST). As the rest of processing operations, the same processing operation as each step illustrated in FIG. 9 is executed.

Similarly, the processing operations in Steps S31, S32, S33, S34, S35, S36, S37, S38, S39, S40, and S41 illustrated in FIG. 17 respectively correspond to the processing operations in Steps S10, S11, S12, S13, S14, S15, S16, S17, S18, S19, and S20 illustrated in FIG. 10. In FIG. 17, the erase verify operations in Steps S32 to S33 are erase verify operations for the group of even strings (EVEN ST), and the erase verify operations in Steps S35 to S36 are erase verify operations for the group of odd strings (ODD ST). As the rest of processing operations, the same processing operation as each step illustrated in FIG. 10 is executed.

According to the present embodiment, when abnormal cells are concentrated in a certain specific range (area), the concentration of the abnormal cells can be detected in a short time. In particular, since the NAND string NS in the erase target block BLK is divided into the group of even strings (EVEN ST) and the group of odd strings (ODD ST), and the erase verify operation is executed for each group, it becomes possible to detect a failure caused between the columns (Tier) of the memory cell array 29. The failure used herein is a failure caused by a current leakage between the word line WL and the bit line BL, for example, when the threshold voltage Vth is not decreased to the desired erase threshold value in the predetermined time. When a current leak path is present between a certain word line WL and a certain bit line BL, since the memory cell of the word line WL cannot be applied with a voltage required for the erase operation state, unerased data remains. Therefore, it is possible to detect a portion where the erase operation is not completed by taking the difference between the columns (Tier) of the memory cell array 29, as the present embodiment.

Moreover, detecting the memory state during the write operation (program operation) or read operation to the memory cell may lead to data loss, since the memory state is detected during the erase operation in the present embodiment, there is no risk of data loss.

According to the present embodiment, since the erase verification according to the even string/odd string selection mode is realized, the quality of the erase verify operation can be compared and distinguished between the even strings and the odd strings.

As described above, according to the present embodiment, there can be provided the semiconductor memory device and the memory state detecting method, each capable of detecting a current leak due to a defect or degradation which occurs in a memory cell in a short time.

Fourth Embodiment (Upper String/Lower String Selection Mode of Memory Strings)

In the fourth embodiment, the NAND string NS in the erase target block BLK is divided into a group of upper strings (UST) and a group of lower strings (LST), and the erase verify operation is executed for each group to detect a concentration of abnormal cells in a certain specific NAND string NS.

Figure 22:
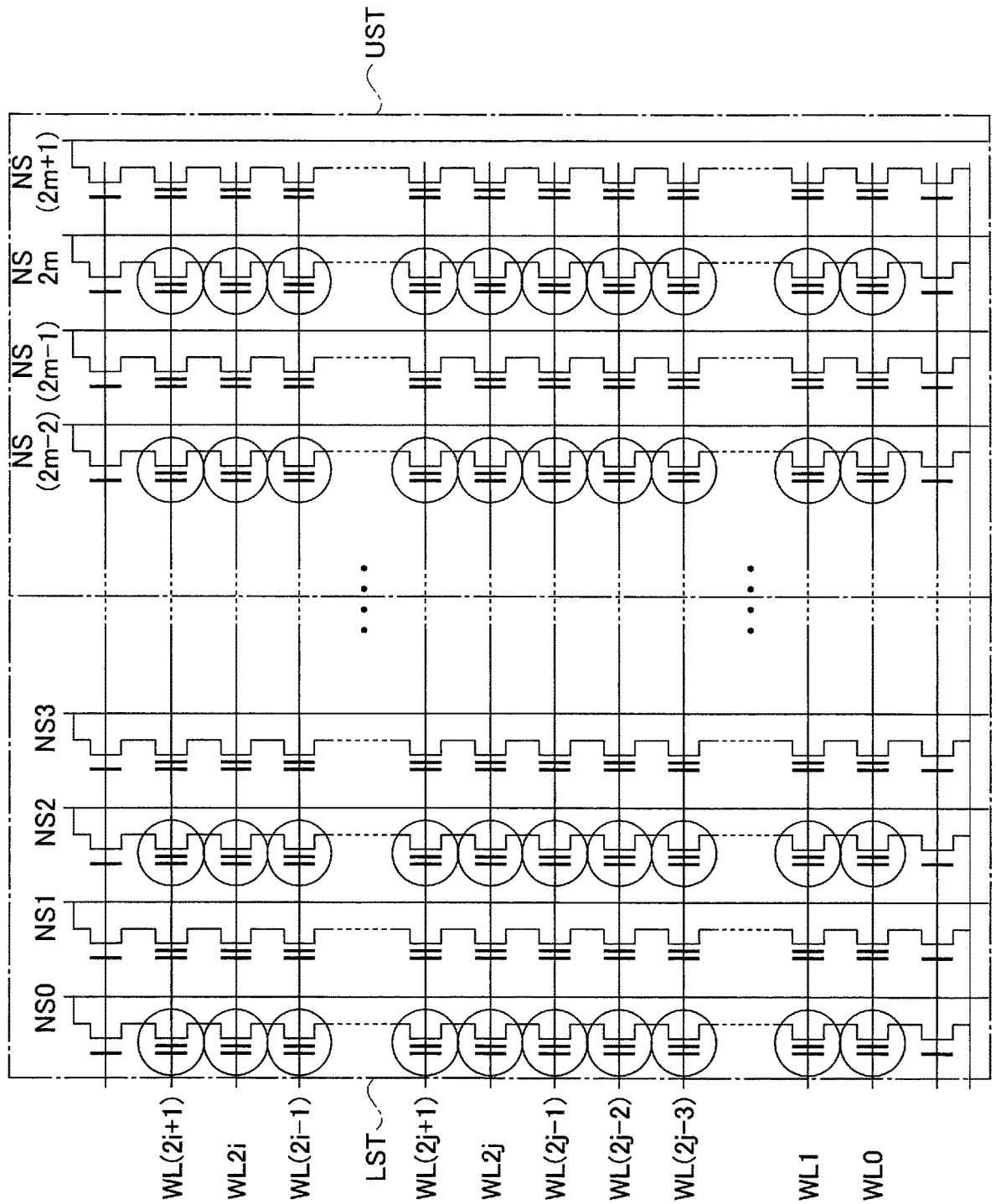
FIG. 22 is an explanatory diagram of upper strings and lower strings in a circuit configuration of one block of the semiconductor memory device according to the fourth embodiment.

In a circuit configuration of one block of the semiconductor memory device according to the present embodiment, upper strings (UST)/lower strings (LST) are shown as illustrated in FIG. 22. In the example illustrated in FIG. 22, the NAND strings NS0, NS1, NS2, NS3, . . . are included in the group of lower strings (LST), and the NAND strings NS(2m−2), NS(2m−1), NS2m, NS(2m+1) are included in the group of upper strings (UST). The word lines WL0, WL1, . . . , WL(2j−3), WL(2j−2), WL(2j−1), WL2j, WL(2j+1), . . . , WL(2i−1), WL2i, and WL(2i+1) respectively intersect the NAND strings NS illustrated in FIG. 22, and memory cells are respectively disposed at the intersection portions.

Figure 20:
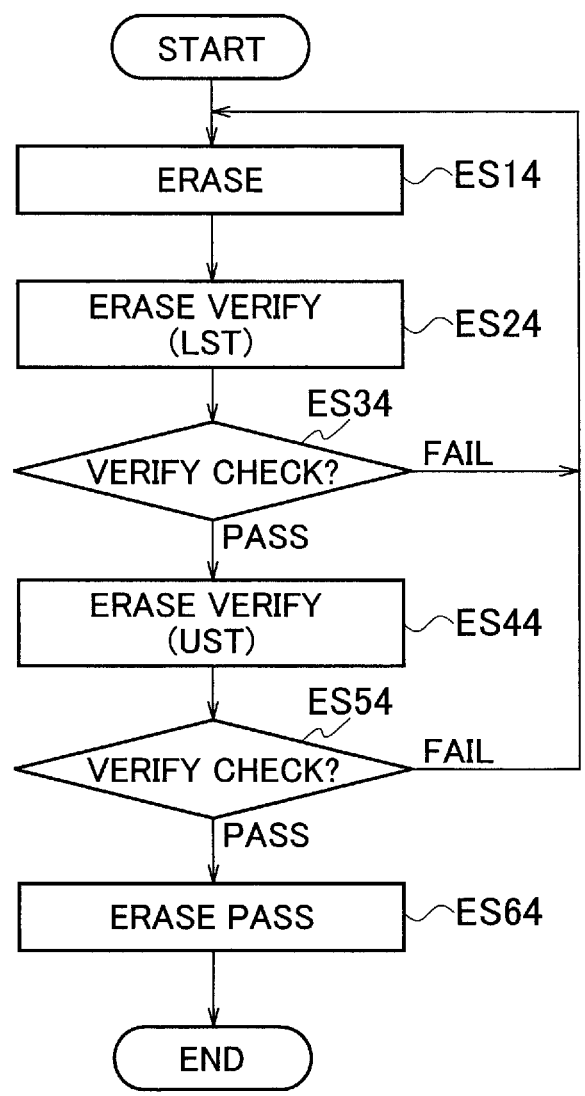
FIG. 20 is a flow chart for explaining an operation of executing an erase verification by means of an upper string/lower string selection mode of memory strings in the semiconductor memory device according to the fourth embodiment.
Figure 21:
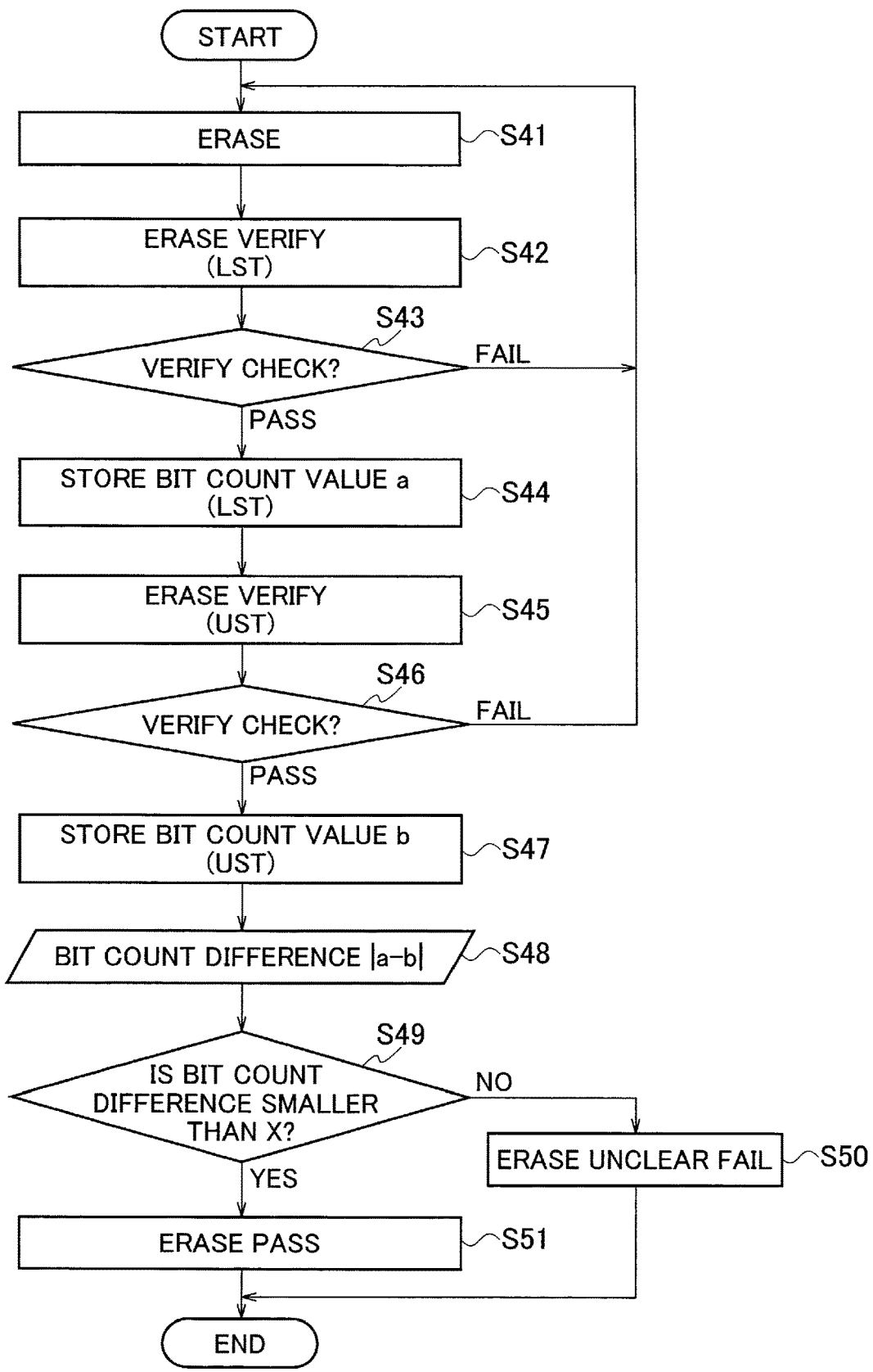
FIG. 21 is a flow chart for explaining a memory state detecting method when the erase verification is executed by means of the upper string/lower string selection mode of memory strings in the semiconductor memory device according to the fourth embodiment.

Moreover, in the semiconductor memory device according to the present embodiment, FIG. 20 illustrates an operation example of the erase verification according to the upper string/lower string selection mode of memory strings, and FIG. 21 illustrates an example of a memory state detecting method when the erase verification is executed by means of the upper string/lower string selection mode of memory strings.

The processing operations in Steps ES14, ES24, ES34, ES44, ES54, and ES64 illustrated in FIG. 20 respectively correspond to the processing operations in Steps ES13, ES23, ES33, ES43, ES53, and ES63 illustrated in FIG. 16. In FIG. 20, the erase verify operations in Steps ES24 and ES34 are erase verify operations for the group of lower strings (LST), and the erase verify operations in Steps ES44 and ES54 are erase verify operations for the group of upper strings (UST). As the rest of processing operations, the same processing operation as each step illustrated in FIG. 16 is executed.

Similarly, the processing operations in Steps S41, S42, S43, S44, S45, S46, S47, S48, S49, S50, and S51 illustrated in FIG. 21 respectively correspond to the processing operations in Steps S31, S32, S33, S34, S35, S36, S37, S38, S39, S40, and S41 illustrated in FIG. 17. In FIG. 21, the erase verify operations in Steps S42 to S43 are erase verify operations for the group of lower strings (LST), and the erase verify operation in Steps S45 to S46 are erase verify operations for the group of upper strings (UST). As the rest of processing operations, the same processing operation as each step illustrated in FIG. 17 is executed.

According to the present embodiment, when abnormal cells are concentrated in a certain specific range (area), the concentration of the abnormal cells can be detected in a short time. In particular, since the NAND string NS in the erase target block BLK is divided into the group of upper strings and the group of lower strings, and the erase verify operation is executed for each group, it becomes possible to detect a failure caused between the columns (Tier) of the memory cell array 29.

Moreover, detecting the memory state during the write operation (program operation) or read operation to the memory cell may lead to data loss, since the memory state is detected during the erase operation in the present embodiment, there is no risk of data loss.

Moreover, according to the present embodiment, since the erase verification according to the upper string/lower string selection mode is realized, the quality of the erase verify operation can be compared and distinguished between the upper strings and the lower strings.

As described above, according to the present embodiment, there can be provided the semiconductor memory device and the memory state detecting method, each capable of detecting a current leak due to a defect or degradation which occurs in a memory cell in a short time.

Fifth Embodiment (Even Plane/Odd Plane Selection Mode of Memory Cell Array)

In the fifth embodiment, a plane PL including a plurality of blocks BLK is divided into a group of even planes (EVEN PL) and a group of odd planes (ODD PL), the erase verify operation is executed for each group to detect a concentration of abnormal cells in a certain specific plane PL.

Figure 25:
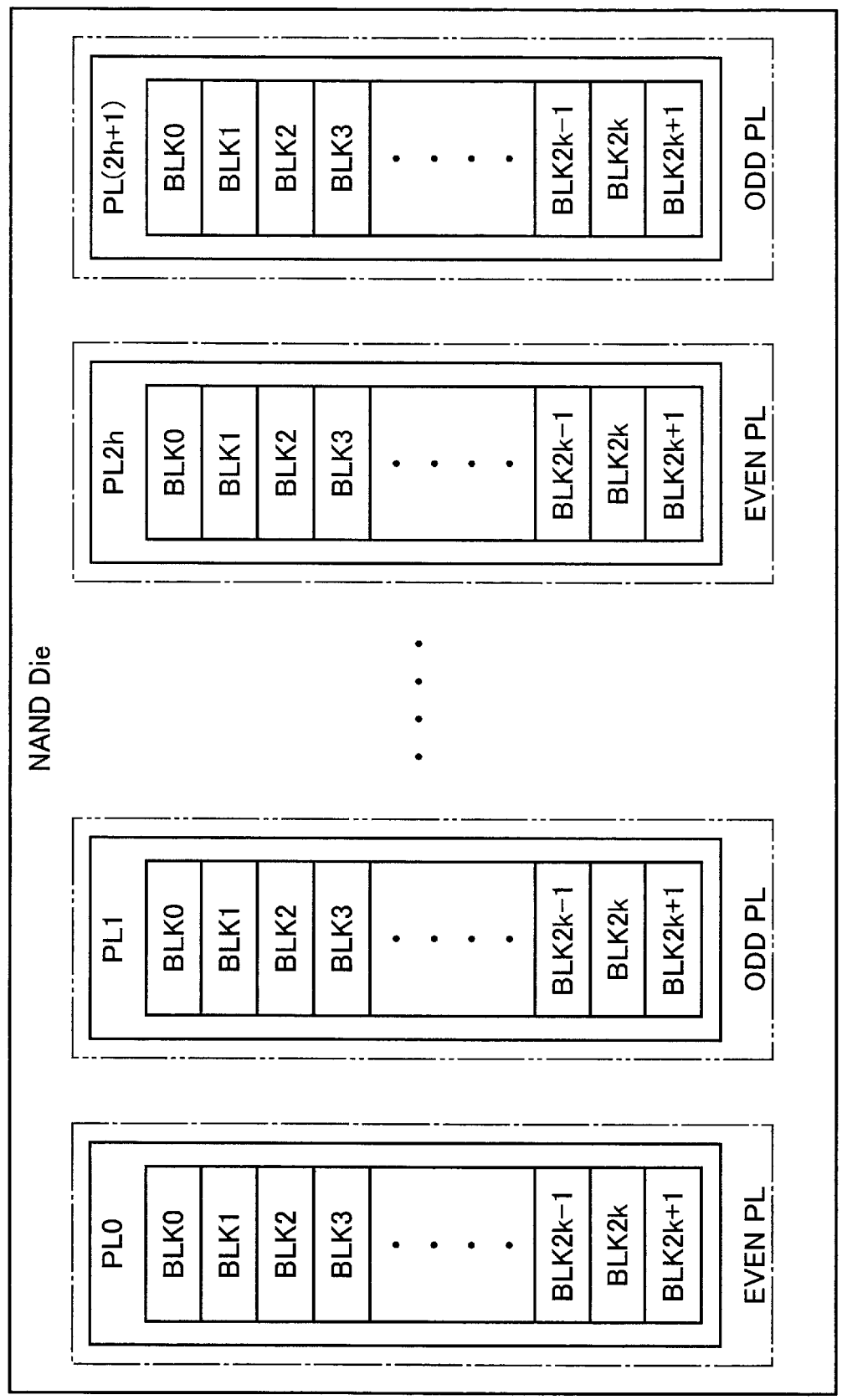
FIG. 25 is an explanatory diagram of even planes and odd planes of the memory cell array in the semiconductor memory device according to the fifth embodiment.

In the semiconductor memory device according to the present embodiment, the group of even planes (EVEN PL) and the group of odd planes (ODD PL) of the memory cell array 29 are shown as illustrated in FIG. 25. In the example illustrated in FIG. 25, the planes PL0, . . . , PL2h are included in the group of the even planes (EVEN PL), and the planes PL1, . . . , PL(2h+1) are included in the group of the odd planes (ODD PL). Each plane PL includes a plurality of blocks BLK0, BLK1, BLK2, BLK3, . . . , BLK(2k−1), BLK2k, and BLK(2k+1).

Figure 23:
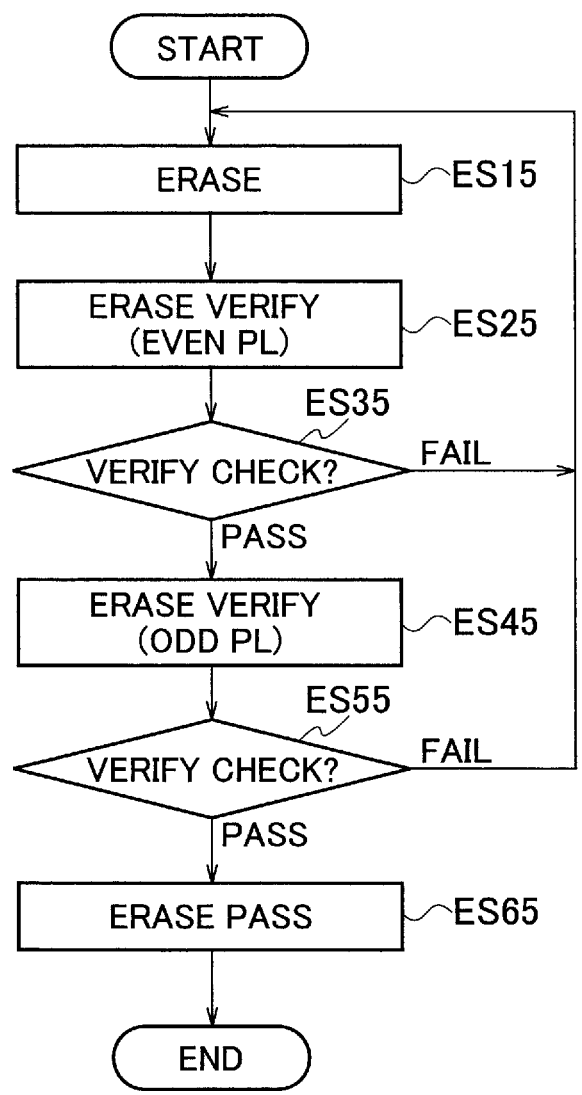
FIG. 23 is a flow chart for explaining an operation of executing an erase verification by means of an even plane/odd plane selection mode of a memory cell array in the semiconductor memory device according to the fifth embodiment.
Figure 24:
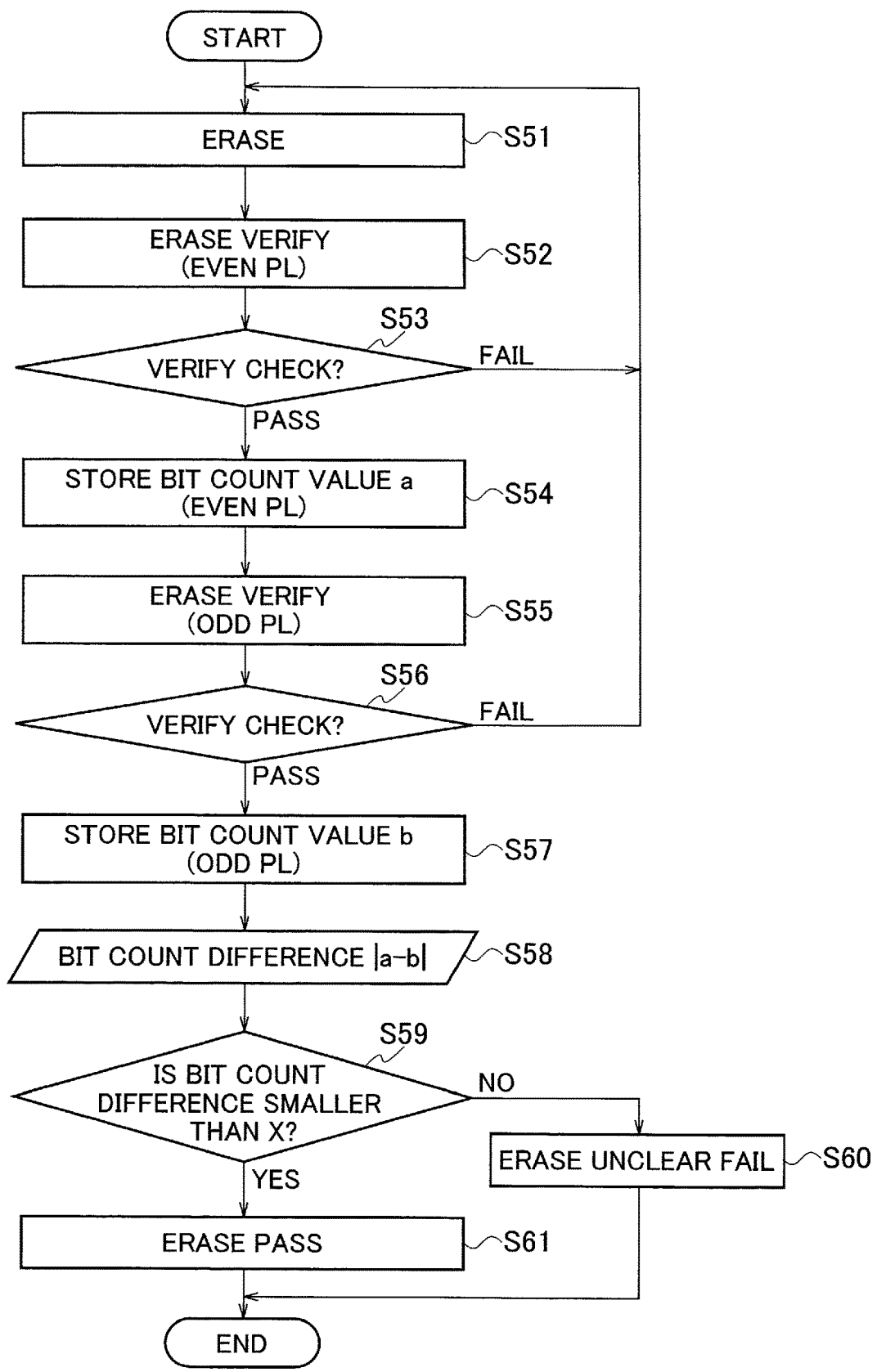
FIG. 24 is a flow chart for explaining a memory state detecting method when the erase verification is executed by means of the even plane/odd plane selection mode of the memory cell array in the semiconductor memory device according to the fifth embodiment.

In the semiconductor memory device related to a present embodiment, FIG. 23 illustrates an operation example of the erase verification according to the even plane/odd plane selection mode of the memory cell array 29, and FIG. 24 illustrates an example of a memory state detecting method when the erase verification is executed by means of the even plane/odd plane selection mode of the memory cell array 29.

The processing operations in Steps ES15, ES25, ES35, ES45, ES55, and ES65 illustrated in FIG. 23 respectively correspond to the processing operations in Steps ES1, ES2, ES3, ES4, ES5, and ES6 illustrated in FIG. 9. In FIG. 23, the erase verify operations in Steps ES25 and ES35 are erase verify operations for the group of the even planes (EVEN PL), and the erase verify operations in Steps ES45 and ES55 are erase verify operations for the group of the odd planes (ODD PL). As the rest of processing operations, the same processing operation as each step illustrated in FIG. 9 is executed.

Similarly, the processing operations in Steps S51, S52, S53, S54, S55, S56, S57, S58, S59, S60, and S61 illustrated in FIG. 24 respectively correspond to the processing operations in Steps S10, S11, S12, S13, S14, S15, S16, S17, S18, S19, and S20 illustrated in FIG. 10. In FIG. 24, the erase verify operations in Steps S52 to S53 are erase verify operations for the group of the even planes (EVEN PL), and the erase verify operations in Steps S55 to S56 are erase verify operations for the group of the odd planes (ODD PL). As the rest of processing operations, the same processing operation as each step illustrated in FIG. 10 is executed.

According to the present embodiment, when abnormal cells are concentrated in a certain specific range (area), the concentration of the abnormal cells can be detected in a short time. In particular, since the erase verification according to the even plane/odd plane selection mode can be realized, the quality of the erase verify operation can be compared and distinguished between the even planes and the odd planes, in the semiconductor memory device includes the plurality of plane PL.

As described above, according to the present embodiment, there can be provided the semiconductor memory device and the memory state detecting method, each capable of detecting a current leak due to a defect or degradation which occurs in a memory cell in a short time.

Sixth Embodiment (Upper Plane/Lower Plane Selection Mode of Memory Cell Array)

In the sixth embodiment, the plane PL including the plurality of blocks BLK is divided into a group of upper planes (UPL) and a group of lower planes (LPL), the erase verify operation is executed for each group to detect a concentration of abnormal cells in a certain specific plane PL.

Figure 28:
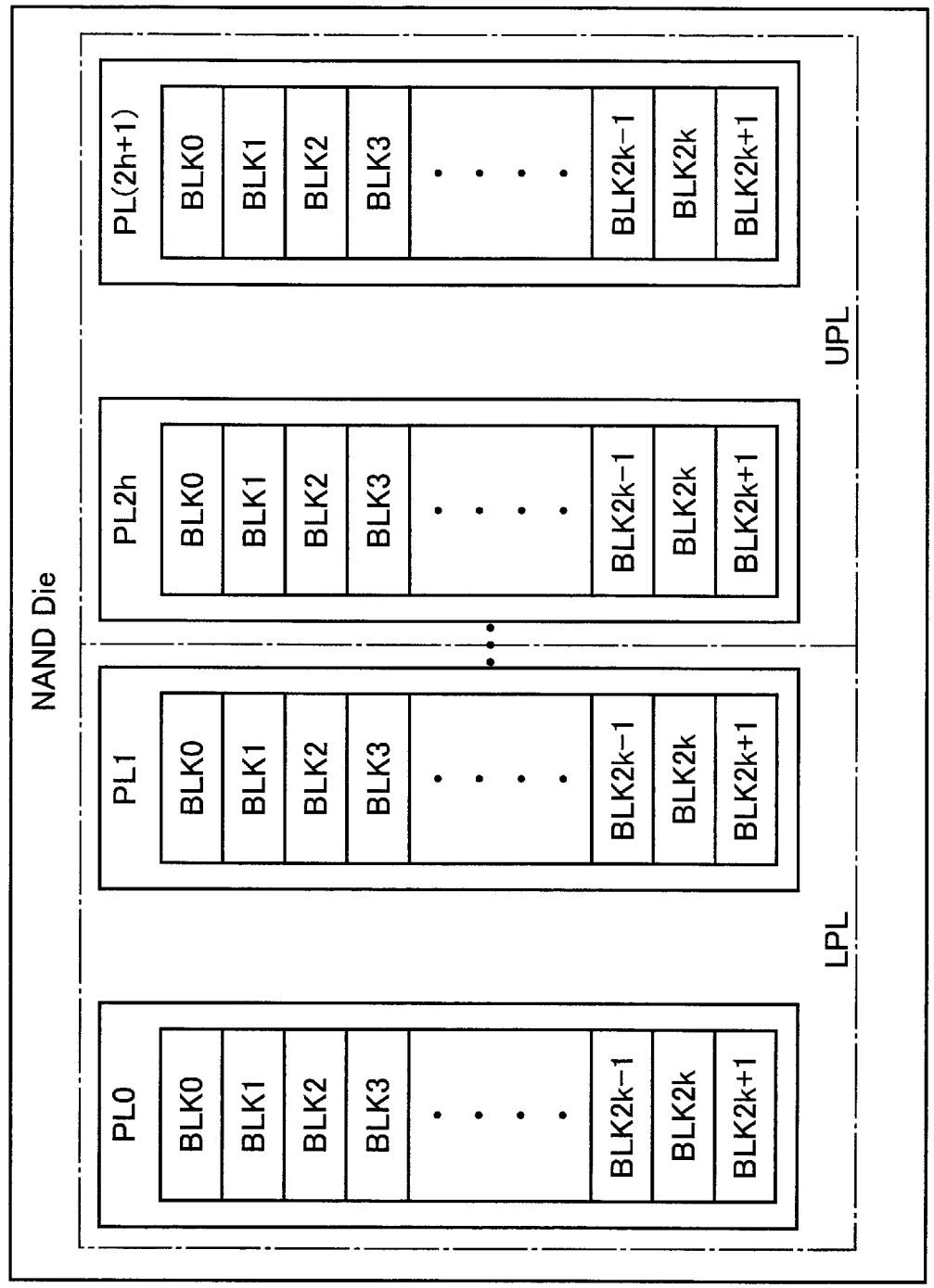
FIG. 28 is an explanatory diagram of upper planes/lower planes of the memory cell array in the semiconductor memory device according to the sixth embodiment.

In the semiconductor memory device according to the sixth embodiment, the group of upper planes (UPL) and the group of lower planes (LPL) of the memory cell array 29 are shown as illustrated in FIG. 28. In the example illustrated in FIG. 28, the planes PL0 and PL1 are included in the group of the lower planes (LPL), and the planes PL2h and PL(2h+1) are included in the group of the upper planes (UPL). Each plane PL includes a plurality of blocks BLK0, BLK1, BLK2, BLK3, ..., BLK(2k−1), BLK2k, and BLK(2k+1).

Figure 26:
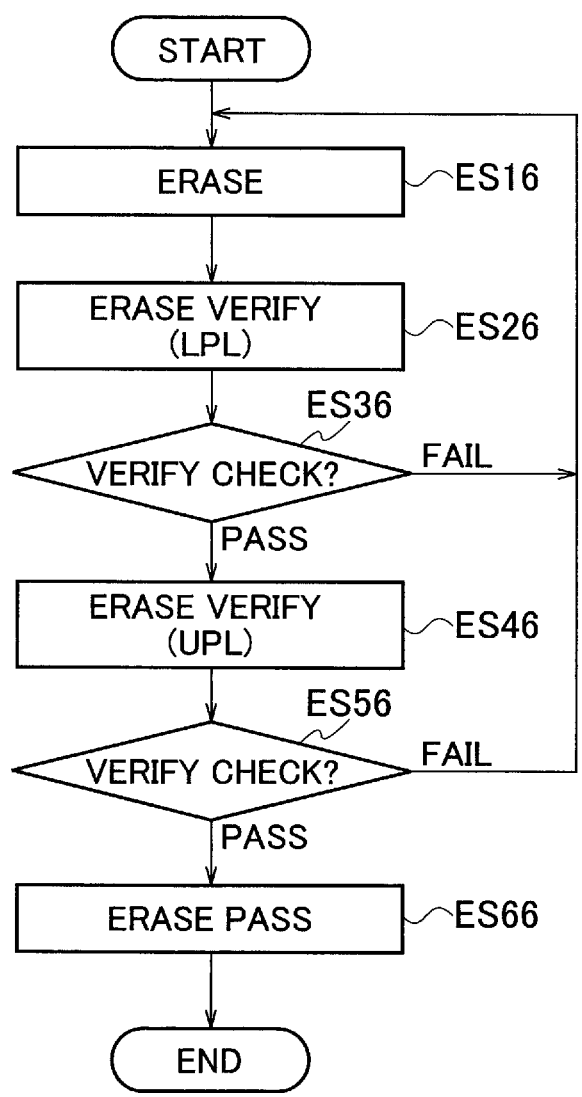
FIG. 26 is a flow chart for explaining an operation of executing an erase verification by means of an upper plane/lower plane selection mode of a memory cell array in the semiconductor memory device according to the sixth embodiment.
Figure 27:
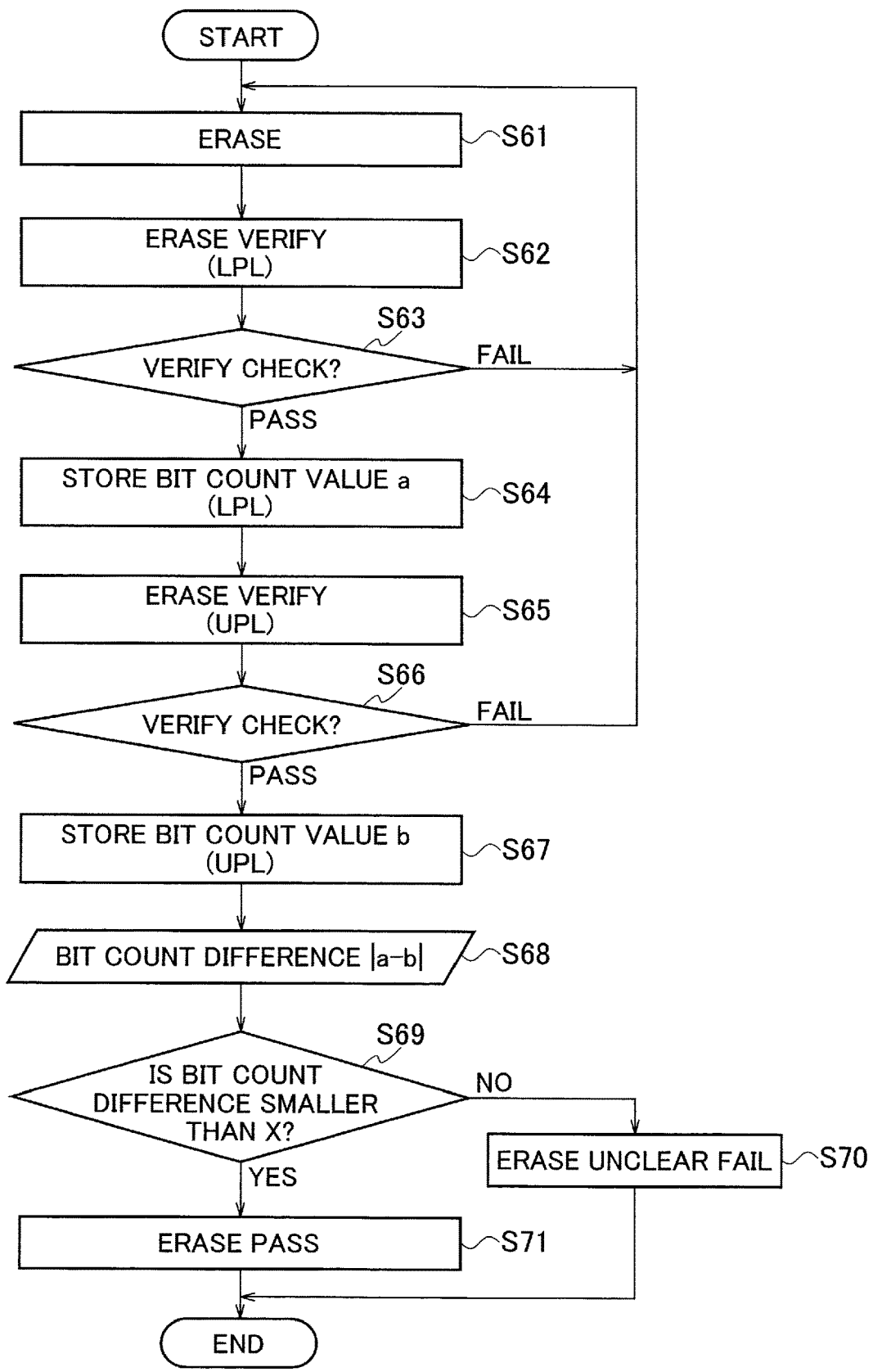
FIG. 27 is a flow chart for explaining a memory state detecting method when the erase verification is executed by means of the upper plane/lower plane selection mode of the memory cell array in the semiconductor memory device according to the sixth embodiment.

In the semiconductor memory device according to the present embodiment, FIG. 26 illustrates an operation example of the erase verification according to the upper plane/lower plane selection mode of the memory cell array 29, and FIG. 27 illustrates an example of a memory state detecting method when the erase verification is executed by means of the upper plane/lower plane selection mode of the memory cell array 29.

The processing operations in Steps ES16, ES26, ES36, ES46, ES56, and ES66 illustrated in FIG. 26 respectively correspond to the processing operations in Steps ES15, ES25, ES35, ES45, ES55, and ES65 illustrated in FIG. 23. In FIG. 26, the erase verify operations in Steps ES26 and ES36 are erase verify operations for the group of the lower planes (LPL), and the erase verify operations in Steps ES46 and ES56 are erase verify operations for the group of the upper planes (UPL). As the rest of processing operations, the same processing operation as each step illustrated in FIG. 23 is executed.

Similarly, the processing operations in Steps S61, S62, S63, S64, S65, S66, S67, S68, S69, S70, and S71 illustrated in FIG. 27 respectively correspond to the processing operations in Steps S51, S52, S53, S54, S55, S56, S57, S58, S59, S60, and S61 illustrated in FIG. 24. In FIG. 27, the erase verify operations in Steps S62 to S63 are erase verify operations for the group of the lower planes (LPL), and the erase verify operations in Steps S65 to S66 are erase verify operations for the group of the upper planes (UPL). As the rest of processing operations, the same processing operation as each step illustrated in FIG. 24 is executed.

According to the present embodiment, when abnormal cells are concentrated in a certain specific range (area), the concentration of the abnormal cells can be detected in a short time. In particular, since the erase verification according to the upper plane/lower plane selection mode can be realized, the quality of the erase verify operation can be compared and distinguished between the upper planes and the lower planes, in the semiconductor memory device includes the plurality of plane PL.

As described above, according to the present embodiment, there can be provided the semiconductor memory device and the memory state detecting method, each capable of detecting a current leak due to a defect or degradation which occurs in a memory cell in a short time.

As explained above, according to the semiconductor memory device and the memory state detecting method according to the embodiment, a current leak due to a defect or degradation which occur in the memory cell can be detected in a short time. Therefore, it is possible to provide a highly reliable and high-quality semiconductor memory device and a memory state detection method.

In addition, although the first to sixth embodiments have illustrated the examples of dividing the target of the erase verify operation into two groups, the number of the groups to be divided is not limited to such examples, but the target of the erase verify operation may be divided into three or more groups. For example, when being divided into three groups, the number of the counter registers (234 and 235) illustrated in FIG. 3 is also 3 (e.g., counter register (234, 235, and 235-1)). Moreover, for example, the count value CNT1 is stored in the counter register 234, the count value CNT2 is stored in the counter register 235, and the count value CNT3 is stored in the counter register 235. The arithmetic circuit 236 reads three count values (CNT1, CNT2, and CNT3) from three counter registers (234, 235, and 235-1), takes a difference between three count values (CNT1, CNT2, and CNT3), and outputs the difference therebetween as the number of second fail flags FC2. The difference between three count values (CNT1, CNT2, and CNT3) can be obtained from a difference between the maximum value and the minimum value of the three count values (CNT1, CNT2, and CNT3).

Moreover, as the value of the erase verify fail flag VFF, "1" (flag ON) may be set to the erase verify fail flag VFF of a bit line BL which is in the ON state, and "0" (flag OFF) may be set to the erase verify fail flag VFF of a bit line BL which is in the OFF state. In this case, the counter 231 counts the number of the erase verify fail flags VFF of which the value is "0" (flag OFF) among the erase verify fail flags VFF and output the counted result as a count value (CNT1, CNT2, ...).

Moreover, the method of grouping is not limited to the examples of the above-mentioned selection modes, and can be selected appropriately as required. Moreover, the above-mentioned select modes, i.e., the even word line/odd word line selection mode, the upper word line/lower word line selection mode of word lines, the even string/odd string selection mode of memory strings, the even string/odd string selection mode of memory strings, and the upper string/lower string selection mode of memory strings, can also be combined with one another. For example, the even word line/odd word line selection mode and the upper word line/lower word line selection mode of word lines are combined with each other, and thereby the target of the erase verify operation may be divided into four groups of the even-numbered upper word lines/odd-numbered upper word lines/even-numbered lower word lines/odd-numbered lower word lines of word lines. Similarly, the even plane/odd plane selection mode of memory cell array and the upper plane/lower plane selection mode of memory cell array are combined with each other, and thereby the target of the erase verify operation may be divided into four groups of the even-numbered upper planes/odd-numbered upper planes/even-numbered lower planes/odd-numbered lower planes of the memory cell array.

Although the applying operation of the erase pulse is collectively executed at the first Step (Step S10 in the example of FIG. 10) in the first embodiment, the operation is not limited thereto, and it may be executed in units of a group in which the erase verify operation is executed. In this case, in the example of FIG. 10, in Step S10, after the erase pulse is applied to the even WL group and the erase verify operation of the even WL is completed, the erase pulse may be applied to the odd WL group between Step S13 and Step S14. The same applies to the second to sixth embodiments.

The erase verify operation may be executed in the reverse order to that described in the first to sixth embodiments. For example, although the example of executing the erase verify operation for the odd WL group after the erase verify operation for the even WL group has been explained in the first embodiment, the erase verify operation for the even WL group may be executed after the erase verify operation for the odd WL group.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions.

The accompanying claims and their equivalents are intended to cover such forms or modifications as would fall within the scope and spirit of the inventions.

What is claimed is:

1. A semiconductor memory device comprising:
a memory cell array comprising a plurality of memory cells, word lines, and bit lines;
a control circuit connected to the memory cell array; and
a data register connected to the memory cell array, the data register configured to store an erase verify fail flag indicating a fail as a result of an erase verify operation for each memory cell, wherein
an erase target block of the semiconductor memory device is divided into word line groups, wherein the control circuit comprising:
a counter configured to receive the erase verify fail flag from the data register, to count a number of the received erase verify fail flags, and to output the counted number thereof as a count value for each group of the memory cells in which the erase verify operation executed;
a plurality of counter registers configured to respectively store the count values output from the counter for the respective group;
an arithmetic circuit configured to take a difference of the plurality of count values respectively stored in the plurality of counter registers and to output a result of the difference as a number of second fail flags;
a criteria register configured to store a number of criteria of the erase verify fail flags set in advance as a number of first fail flags; and
a comparator configured to compare the number of the first fail flags stored in the criteria register with the number of the second fail flags output from the arithmetic circuit, and to detect a memory state on the basis of a comparison result to be output as a detected result.

2. The semiconductor memory device according to claim 1, wherein
as a result of applying an erase pulse to the memory cell array, the erase verify fail flag of the bit line that has been turned off among the plurality of bit lines is turned ON, and the counter counts a number of the erase verify fail flags which are turned ON and outputs the counted result as a count value.

3. The semiconductor memory device according to claim 1, wherein
when the number of the second fail flags is larger than the number of the first fail flags, the comparator determines that a number of the memory cells having unerased data is equal to or greater than a predetermined reference value.

4. The semiconductor memory device according to claim 1, wherein
the erase target block is grouped into a group of even-numbered word lines and a group of odd-numbered word lines, and
the erase verify fail flag is stored in the data register for each group, wherein
the counter counts the number of the erase verify fail flags for each group and outputs the counted result as the count value for each group.

5. The semiconductor memory device according to claim 1, wherein
the erase target block is grouped into a group of upper word lines and a group of lower word lines, and
the erase verify fail flag is stored in the data register for each group, wherein
the counter counts the number of the erase verify fail flags for each group and outputs the counted result as the count value for each group.

6. The semiconductor memory device according to claim 1, wherein
the erase target block is grouped into a group of even-numbered upper word lines, a group of odd-numbered upper word lines, a group of even-numbered lower word lines, and a group of odd-numbered lower word lines, and
the erase verify fail flag is stored in the data register for each group, wherein
the counter counts the number of the erase verify fail flags for each group and outputs the counted result as the count value for each group.

7. A semiconductor memory device comprising:
a memory cell array comprising a plurality of memory cells, word lines, and bit lines;
a control circuit connected to the memory cell array; and
a data register connected to the memory cell array, the data register configured to store an erase verify fail flag indicating a fail as a result of an erase verify operation for each memory cell, wherein
an erase target block of the semiconductor memory device is divided into memory string groups, wherein the control circuit comprising:
a counter configured to receive the erase verify fail flag from the data register, to count a number of the received erase verify fail flags, and to output the counted number thereof as a count value for each group of the memory cells in which the erase verify operation executed;
a plurality of counter registers configured to respectively store the count values output from the counter for the respective group;
an arithmetic circuit configured to take a difference of the plurality of count values respectively stored in the plurality of counter registers and to output a result of the difference as a number of second fail flags;
a criteria register configured to store a number of criteria of the erase verify fail flags set in advance as a number of first fail flags; and a comparator configured to compare the number of the first fail flags stored in the criteria register with the number of the second fail flags output from the arithmetic circuit, and to detect a memory state on the basis of a result of the comparison to be output as a detected result.

8. The semiconductor memory device according to claim 7, wherein
as a result of applying an erase pulse to the memory cell array, the erase verify fail flag of the bit line that has been turned off among the plurality of bit lines is turned ON, and
the counter counts a number of the erase verify fail flags which are turned ON and outputs the counted result as a count value.

9. The semiconductor memory device according to claim 7 wherein,
when the number of the second fail flags is larger than the number of the first fail flags, the comparator determines that a number of the memory cells having unerased data is equal to or greater than a predetermined reference value.

10. The semiconductor memory device according to claim 7, wherein
the erase target block is grouped into a group of even-numbered memory strings and a group of odd-numbered memory strings, and
the erase verify fail flag is stored in the data register for each group, wherein
the counter counts the number of the erase verify fail flags for each group and outputs the counted result as the count value for each group.

11. The semiconductor memory device according to claim 7, wherein
the erase target block is grouped into a group of upper memory strings and a group of lower memory strings, and
the erase verify fail flag is stored in the data register for each group, wherein
the counter counts the number of the erase verify fail flags for each group and outputs the counted result as the count value for each group.

12. A semiconductor memory device comprising:
a memory cell array comprising a plurality of memory cells, word lines, and bit lines;
a control circuit connected to the memory cell array; and
a data register connected to the memory cell array, the data register configured to store an erase verify fail flag indicating a fail as a result of an erase verify operation for each memory cell, wherein
the semiconductor memory device is grouped into a group of planes, wherein the control circuit comprising:
a counter configured to receive the erase verify fail flag from the data register, to count a number of the received erase verify fail flags, and to output the counted number thereof as a count value for each group of the memory cells in which the erase verify operation executed;
a plurality of counter registers configured to respectively store the count values output from the counter for the respective group;
an arithmetic circuit configured to take a difference of the plurality of count values respectively stored in the plurality of counter registers and to output a result of the difference as a number of second fail flags;
a criteria register configured to store a number of criteria of the erase verify fail flags set in advance as a number of first fail flags; and a comparator configured to compare the number of the first fail flags stored in the criteria register with the number of the second fail flags output from the arithmetic circuit, and to detect a memory state on the basis of a result of the comparison to be output as a detected result.

13. The semiconductor memory device according to claim 12, wherein
as a result of applying an erase pulse to the memory cell array, the erase verify fail flag of the bit line that has been turned off among the plurality of bit lines is turned ON, and
the counter counts a number of the erase verify fail flags which are turned ON and outputs the counted result as a count value.

14. The semiconductor memory device according to claim 12, wherein
when the number of the second fail flags is larger than the number of the first fail flags, the comparator determines that a number of the memory cells having unerased data is equal to or greater than a predetermined reference value.

15. The semiconductor memory device according to claim 12, wherein
the semiconductor memory device is grouped into a group of even planes and a group of odd planes, and
the erase verify fail flag is stored in the data register for each group, wherein
the counter counts the number of the erase verify fail flags for each group and outputs the counted result as the count value for each group.

16. The semiconductor memory device according to claim 12, wherein
the semiconductor memory device is grouped into a group of upper planes and a group of lower planes, and
the erase verify fail flag is stored in the data register for each group, wherein
the counter counts the number of the erase verify fail flags for each group and outputs the counted result as the count value for each group.

17. A memory state detecting method of a semiconductor memory device,
the semiconductor memory device comprising a memory cell array comprising a plurality of memory cells, word lines, and bit lines, a control circuit connected to the memory cell array, and a data register connected to the memory cell array, the data register configured to store an erase verify fail flag indicating a fail as a result of an erase verify operation for each memory cell,
the memory state detecting method comprising:
applying an erase pulse to an erase target memory cell of the semiconductor memory device;
executing an erase verify operation of verifying whether or not data of the memory cell to which the erase pulse is applied is correctly erased for each of predetermined groups of the erase target memory cell;
turning ON the erase verify fail flag of a memory cell of which the data is not correctly erased;
storing the erase verify fail flag in the data register after the erase verify operation is executed;
receiving, by a counter in the control circuit, the erase verify fail flag from the data register, and storing a count value obtained by counting the number of the received erase verify fail flags in each of a plurality of counter registers for each group;
taking, by an arithmetic circuit in the control circuit, a difference between the plurality of count values respectively stored in the plurality of counter registers, and outputting a result of the difference as a number of second fail flags; and comparing, by a comparator in the control circuit, a number of first fail flags stored in a criteria register as a number of criteria of the erase verify fail flag with the number of the second fail flags output from the arithmetic circuit, and detecting a memory state on the basis of a result of the comparison to be output as a detected result.

18. The memory state detecting method according to claim 17, wherein an erase target block of the semiconductor memory device is grouped into a group of even-numbered word lines and a group of odd-numbered word lines, and the erase verify fail flag is stored in the data register for each group, wherein the counter counts the number of the erase verify fail flags for each group and outputs the counted result as the count value for each group.

19. The memory state detecting method according to claim 17, wherein an erase target block of the semiconductor memory device is grouped into a group of even-numbered memory strings and a group of odd-numbered memory strings, and the erase verify fail flag is stored in the data register for each group, wherein the counter counts the number of the erase verify fail flags for each group and outputs the counted result as the count value for each group.

20. The memory state detecting method according to claim 17, wherein the semiconductor memory device is grouped into a group of even planes and a group of odd planes, and the erase verify fail flag is stored in the data register for each group, wherein the counter counts the number of the erase verify fail flags for each group and outputs the counted result as the count value for each group.

* * * * *